US012610711B2

(12) United States Patent (10) Patent No.: US 12,610,711 B2
Nakamura et al. (45) Date of Patent: Apr. 21, 2026

(54) ORGANIC DEVICE AND MASK GROUP

(71) Applicant: DAI NIPPON PRINTING CO., LTD., Tokyo (JP)

(72) Inventors: Yusuke Nakamura, Tokyo (JP); Naoki Nishimura, Tokyo (JP); Isao Miyatani, Tokyo (JP); Hiroshi Yano, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 337 days.

(21) Appl. No.: 18/328,958

(22) Filed: Jun. 5, 2023

(65) Prior Publication Data

US 2024/0081120 A1 Mar. 7, 2024

(30) Foreign Application Priority Data

Jun. 10, 2022 (JP) .................................. 2022-094735

(51) Int. Cl.
*H10K 59/35* (2023.01)
*C23C 14/04* (2006.01)

(52) U.S. Cl.
CPC ......... *H10K 59/352* (2023.02); *C23C 14/042* (2013.01); *H10K 59/353* (2023.02)

(58) Field of Classification Search
CPC ... H10K 59/352; H10K 59/353; C23C 14/042
See application file for complete search history.

(56) References Cited

U.S. PATENT DOCUMENTS 9,818,803 B2 11/2017 Lee
2019/0157368 A1* 5/2019 Park ..................... H10K 59/352

| | | | |
|---|---|---|---|
| 2020/0105843 A1 | 4/2020 | Baek et al. | |
| 2022/0069031 A1* | 3/2022 | Yue ...................... | H10K 59/352 |
| 2022/0077244 A1* | 3/2022 | Wang ................. | G09G 3/3233 |
| 2022/0209124 A1 | 6/2022 | Nakamura et al. | |
| 2023/0006003 A1 | 1/2023 | Huang et al. | |

FOREIGN PATENT DOCUMENTS

| | | |
|---|---|---|
| CN | 113488521 A | 10/2021 |
| CN | 216563200 U | 5/2022 |
| EP | 2 709 155 A1 | 3/2014 |
| JP | 6143043 B2 | 6/2017 |
| JP | 6301610 B2 | 3/2018 |
| JP | 6672194 B2 | 3/2020 |
| WO | 2021/051139 A1 | 3/2021 |

OTHER PUBLICATIONS

Extended European Search Report (Application No. 23177332.6) dated Oct. 10, 2023 (11 pages).

* cited by examiner

*Primary Examiner* — Anne M Hines
(74) *Attorney, Agent, or Firm* — BURR PATENT LAW, PLLC

(57) ABSTRACT

A first color electrodes and a third color electrodes may be arrayed in an alternating manner following a first direction, and may also be arrayed in an alternating manner following a second direction that is orthogonal to the first direction. A first color electrodes that are situated in a first display region and a second display region may be arrayed at a first pitch following each of the first direction and the second direction. The first color electrodes and the third color electrodes that are situated in the second display region may be arrayed so as to alternate between a second pitch and a third pitch, following each of the first direction and the second direction. The second pitch may differ from the third pitch.

9 Claims, 23 Drawing Sheets

170

Pc

G1          G2

ORGANIC DEVICE AND MASK GROUP

CROSS-REFERENCE TO RELATED APPLICATIONS

The present application is based upon Japanese Patent Application No. 2022-094735, filed on Jun. 10, 2022, and claims the benefit of priority thereof. The entire contents of this application are incorporated herein by reference.

TECHNICAL FIELD

An embodiment of the present disclosure relates to an organic device and a mask group.

BACKGROUND ART

There is need for high-definition display devices in devices such as smartphones, tablet PCs, and so forth. Pixel density of 400 ppi or more, for example, is required of display devices. There also is demand for display devices that support ultra-high definition (UHD). There are cases in which such display devices have pixel density of 800 ppi or more, for example.

Organic EL display devices, which are an example of organic devices, are gathering attention due to having good responsivity and/or low electric power consumption. There is known a method for forming pixels in organic EL display devices in which material for making up the pixels is applied to a substrate by vapor deposition. In vapor deposition, a vapor deposition mask, in which through holes are arrayed according to a desired pattern, is used to form pixels and electrodes according to the desired pattern. For example, conductive material is first applied onto a substrate using the vapor deposition mask, thereby forming first electrodes in a pattern corresponding to the pixels. Subsequently, another vapor deposition mask is used to apply an organic material onto the first electrodes, thereby forming a luminescent layer. Thereafter, conductive material is applied onto the luminescent layer, thereby forming a second electrode.

PTL 1: Japanese Patent No. 6143043
PTL 2: Japanese Patent No. 6301610
PTL 3: Japanese Patent No. 6672194

SUMMARY

In organic devices, there are cases in which light is readily transmitted in regions where no first electrodes are present. In a case in which layout periodicity of the first electrodes is high, there conceivably is a possibility that diffraction of light will occur, and intensity of diffracted light will increase.

An organic device according to an embodiment of the present disclosure is an organic device that has a first display region, and a second display region that is situated at a position different from the first display region in plan view. The organic device includes a substrate, a first electrode situated on the substrate, an organic layer situated on the first electrode, and a second electrode that is situated on the organic layer, and that also covers the first electrode in plan view. The first electrode includes a plurality of first color electrodes, a plurality of second color electrodes, and a plurality of third color electrodes. The organic layer includes a plurality of first color organic layers situated on the first color electrodes, a plurality of second color organic layers situated on the second color electrodes, and a plurality of third color organic layers situated on the third color electrodes. One pixel is made up of one of the first color electrodes, one of the second color electrodes, and two of the third color electrodes. The first color electrodes and the third color electrodes are arrayed in an alternating manner following a first direction, and are also arrayed in an alternating manner following a second direction that is orthogonal to the first direction. The first color electrodes that are situated in the first display region and the second display region are arrayed at a first pitch following each of the first direction and the second direction. The first color electrodes and the third color electrodes that are situated in the second display region are arrayed so as to alternate between a second pitch and a third pitch, following each of the first direction and the second direction. The second pitch differs from the third pitch.

A mask group according to an embodiment of the present disclosure includes a first mask including first through holes, a second mask including second through holes, and a third mask including third through holes. A mask stack in which the first mask, the second mask, and the third mask are stacked, includes a mask first region, and a mask second region that is situated at a different position from the mask first region in plan view. One through hole group is made up of one of the first through holes, one of the second through holes, and two of the third through holes. In plan view of the mask stack, the first through holes and the third through holes are arrayed in an alternating manner following a first direction, and are also arrayed in an alternating manner following a second direction that is orthogonal to the first direction. The first through holes that are situated in the mask first region and the mask second region are arrayed at a first pitch following each of the first direction and the second direction. The first through holes and the third through holes that are situated in the mask second region are arrayed so as to alternate between a second pitch and a third pitch, following each of the first direction and the second direction. The second pitch differs from the third pitch.

According to the present disclosure, intensity of diffracted light occurring due to light being transmitted through the organic device can be reduced.

DESCRIPTION OF EMBODIMENTS

Figure 1:
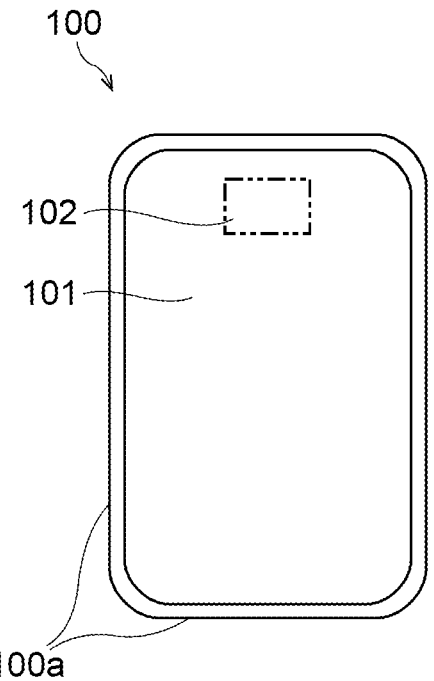
FIG. 1 is a plan view illustrating an example of an organic device according to an embodiment of the present disclosure.

In the present specification and the present drawings, unless specifically stated otherwise, terms meaning matter serving as a basis for certain configurations, such as "substrate" "base material", "plate", "sheet", "film", and so forth, are not distinguished from each other on the basis of difference in naming alone.

Further, unless specifically stated otherwise, terms such as "parallel", "perpendicular", and so forth, and values of length and angle and so forth, used to identify shapes and geometric conditions and the extent thereof in the present specification and the present drawings, for example, are to be interpreted so as to include a range of an extent in which similar functions can be anticipated, without being bound by the strict meaning thereof.

In the present specification and the present drawings, unless specifically stated otherwise, a case in which a certain configuration in a certain member, a certain region, or the like is "above" or "below", "on the upper side from" or "on the lower side from", or "upward from" or "downward from" another configuration in another member, another region, or the like, includes a case in which the certain configuration is in direct contact with the other configuration. This also includes a case in which a separate configuration from the certain configuration and the other configuration is included therebetween, i.e., a case of being in indirect contact. Also, unless specifically stated otherwise, an up-down direction of terms such as "above", "on the upper side from", "upward from", or "below", "on the lower side from", or "downward from" may be reversed.

In the present specification and the present drawings, unless specifically stated otherwise, parts that are the same parts or parts having similar functions are denoted by the same signs or similar signs, and repetitive description thereof may be omitted in some cases. Also, there are cases in which the dimensional ratios in the drawings differ from the actual ratio, for sake of convenience, and part of configurations may be omitted from the drawings.

In the present specification and the present drawings, unless specifically stated otherwise, embodiments of the present disclosure may be combined with other embodiments and modifications insofar as no contradiction arises. Also, other embodiments may be combined with other embodiments, or other embodiments and modifications may be combined, insofar as no contradiction arises. Also, modifications may be combined with each other insofar as no contradiction arises.

In the present specification and the present drawings, in a case of disclosing a plurality of processes regarding to a method such as a manufacturing method or the like, other processes that are not disclosed may be carried out between processes that are disclosed, unless specifically stated otherwise. Also, the order of processes that are disclosed is optional, insofar as no contradiction arises.

In the present specification and the present drawings, unless specifically stated otherwise, ranges represented by the symbol "-" include the numerical values or elements placed before and after the symbol "-". For example, a numerical value range defined by the expression "34-38% by mass" is the same as a numerical value range defined by the expression "34% by mass or more and 38% by mass or less". For example, a range defined by the expression "masks 50A-50C" includes masks 50A, 50B, and 50C.

In an embodiment in the present specification, an example will be described in which a mask group including a plurality of masks is used to form electrodes on a substrate at the time of manufacturing an organic EL display device. It should be noted, however, that the usage of the mask group is not limited in particular, and the present embodiment can be applied to mask groups used in various usages. For example, the mask group according to the present embodiment may be used to form electrodes for devices for displaying or projecting images or video for expressing virtual reality that is so called VR, or augmented reality that is so-called AR. Also, the mask group according to the present embodiment may be used to form electrodes for display devices other than organic EL display devices, such as electrodes for liquid crystal display devices and so forth. Also, the mask group according to the present embodiment may be used to form electrodes for organic devices other than display devices, such as electrodes for pressure sensors, or the like.

A first aspect of the present disclosure is an organic device having a first display region, and a second display region that is situated at a position different from the first display region in plan view, the organic device including a substrate, a first electrode situated on the substrate, an organic layer situated on the first electrode, and a second electrode that is situated on the organic layer, and that also covers the first electrode in plan view.

The first electrode includes a plurality of first color electrodes, a plurality of second color electrodes, and a plurality of third color electrodes.

The organic layer includes a plurality of first color organic layers situated on the first color electrodes, a plurality of second color organic layers situated on the second color electrodes, and a plurality of third color organic layers situated on the third color electrodes.

One pixel is made up of one of the first color electrodes, one of the second color electrodes, and two of the third color electrodes.

The first color electrodes and the third color electrodes are arrayed in an alternating manner following a first direction, and are also arrayed in an alternating manner following a second direction that is orthogonal to the first direction.

The first color electrodes that are situated in the first display region and the second display region are arrayed at a first pitch following each of the first direction and the second direction.

The first color electrodes and the third color electrodes that are situated in the second display region are arrayed so as to alternate between a second pitch and a third pitch, following each of the first direction and the second direction.

The second pitch differs from the third pitch.

A second aspect of the present disclosure may be the organic device according to the above first aspect, in which the first color electrodes and the third color electrodes that are situated in the first display region are arrayed at a fourth pitch, following each of the first direction and the second direction, and the fourth pitch is half of the first pitch.

A third aspect of the present disclosure may be the organic device according to the above first aspect, in which the first color electrodes and the third color electrodes that are situated in the first display region are arrayed so as to alternate between the second pitch and the third pitch, following each of the first direction and the second direction.

A fourth aspect of the present disclosure may be the organic device according to each of the above first aspect to the above third aspect, in which the first color electrode and the third color electrodes that make up one of the pixels situated in the second display region are arrayed at the second pitch, following each of the first direction and the second direction, and the second pitch is smaller than the third pitch.

A fifth aspect of the present disclosure may be the organic device according to each of the above first aspect to the above fourth aspect, in which the second color electrodes and the third color electrodes are arrayed in an alternating manner following the first direction, and are also arrayed in an alternating manner following the second direction, the second color electrodes are arrayed at the first pitch following each of the first direction and the second direction, in each of the first display region and the second display region, and the second color electrodes and the third color electrodes that are situated in the second display region are arrayed so as to alternate between the second pitch and the third pitch, following each of the first direction and the second direction.

A sixth aspect of the present disclosure may be the organic device according to the above fifth aspect, in which the second color electrodes and the third color electrodes situated in the first display region are arrayed at a fourth pitch, following each of the first direction and the second direction, and the fourth pitch is half of the first pitch.

A seventh aspect of the present disclosure may be the organic device according to the above fifth aspect, in which the second color electrodes and the third color electrodes that are situated in the first display region are arrayed so as to alternate between the second pitch and the third pitch, following each of the first direction and the second direction.

An eighth aspect of the present disclosure may be the organic device according to each of the above fifth aspect to the above seventh aspect, in which the second color electrode and the third color electrodes that make up one of the pixels situated in the second display region are arrayed at the second pitch, following each of the first direction and the second direction, and the second pitch is smaller than the third pitch.

A ninth aspect of the present disclosure may be the organic device according to each of the above first aspect to the above eighth aspect, in which a proportion of the second pitch as to the third pitch is 0.50-0.70.

A tenth aspect of the present disclosure is a mask group, including a first mask including first through holes, a second mask including second through holes, and a third mask including third through holes.

A mask stack in which the first mask, the second mask, and the third mask are stacked, includes a mask first region, and a mask second region that is situated at a different position from the mask first region in plan view.

One through hole group is made up of one of the first through holes, one of the second through holes, and two of the third through holes.

In plan view of the mask stack, the first through holes and the third through holes are arrayed in an alternating manner following a first direction, and are also arrayed in an alternating manner following a second direction that is orthogonal to the first direction.

The first through holes that are situated in the mask first region and the mask second region are arrayed at a first pitch following each of the first direction and the second direction.

The first through holes and the third through holes that are situated in the mask second region are arrayed so as to alternate between a second pitch and a third pitch, following each of the first direction and the second direction.

The second pitch differs from the third pitch.

An eleventh aspect of the present disclosure may be the mask group according to the above tenth aspect, in which the first through holes and the third through holes that are situated in the mask first region are arrayed at a fourth pitch, following each of the first direction and the second direction, and the fourth pitch is half of the first pitch.

A twelfth aspect of the present disclosure may be the mask group according to the above tenth aspect, in which the first through holes and the third through holes that are situated in the mask first region are arrayed so as to alternate between the second pitch and the third pitch, following each of the first direction and the second direction.

A thirteenth aspect of the present disclosure may be the mask group according to each of the above tenth aspect to the above twelfth aspect, in which the first through hole and the third through holes that make up one of the through hole group situated in the mask second region are arrayed at the second pitch, following each of the first direction and the second direction, and the second pitch is smaller than the third pitch.

A fourteenth aspect of the present disclosure may be the mask group according to each of the above tenth aspect to the above thirteenth aspect, in which the second through holes and the third through holes are arrayed in an alternating manner following the first direction, and are also arrayed in an alternating manner following the second direction, the second through holes are arrayed at the first pitch following each of the first direction and the second direction, in each of the mask first region and the mask second region, and the second through holes and the third through holes that are situated in the mask second region are arrayed so as to alternate between the second pitch and the third pitch, following each of the first direction and the second direction.

A fifteenth aspect of the present disclosure may be the mask group according to the above fourteenth aspect, in which the second through holes and the third through holes situated in the mask first region are arrayed at a fourth pitch, following each of the first direction and the second direction, and the fourth pitch is half of the first pitch.

A sixteenth aspect of the present disclosure may be the mask group according to the above fourteenth aspect, in which the second through holes and the third through holes that are situated in the mask first region are arrayed so as to alternate between the second pitch and the third pitch, following each of the first direction and the second direction.

A seventeenth aspect of the present disclosure may be the mask group according to each of the above fourteenth aspect to the above sixteenth aspect, in which the second through hole and the third through holes that make up one of the through hole group situated in the mask second region are arrayed at the second pitch, following each of the first direction and the second direction, and the second pitch is smaller than the third pitch.

An eighteenth aspect of the present disclosure may be the mask group according to each of the above tenth aspect to the above seventeenth aspect, in which a proportion of the second pitch as to the third pitch is 0.50-0.70.

An embodiment of the present disclosure will be described in detail with reference to the drawings. Note that the embodiment described below is an example of embodiments of the present disclosure, and that the present disclosure should not be interpreted limited to these embodiments alone.

An organic device 100 will be described with reference to FIG. 1 and FIG. 2. FIG. 1 is a plan view illustrating an example of the organic device 100 as viewed along a normal direction of a substrate 110 of the organic device 100. In the description in the present specification viewing a basic member such as a substrate or the like along the normal direction of a plane thereof will also be referred to plan view.

The organic device 100 may have a first display region 101 and a second display region 102 in plan view, as illustrated in FIG. 1. The second display region 102 may be positioned at a different position from the first display region 101 in plan view. The second display region 102 may have a smaller area than the first display region 101. The second display region 102 may be surrounded by the first display region 101, as illustrated in FIG. 1.

The second display region 102 may be a region in which an optical part, which realizes some sort of function by detecting light, takes in light. Elements 115 are present in the second display region 102, which will be described later. Accordingly, in a case in which the elements 115 are pixels, images and video can be displayed in the second display region 102. Hereinafter, images and video will be referred to as images and so forth. In this way, the second display region 102 is capable of detecting light, and displaying images and so forth. Optical parts that are realized by detecting light include, for example, cameras, fingerprint sensors, facial recognition sensors, other such sensors, and so forth. The higher the transmissivity of the second display region 102 is, the greater the amount of light that can be received by the sensor is.

Figure 2:
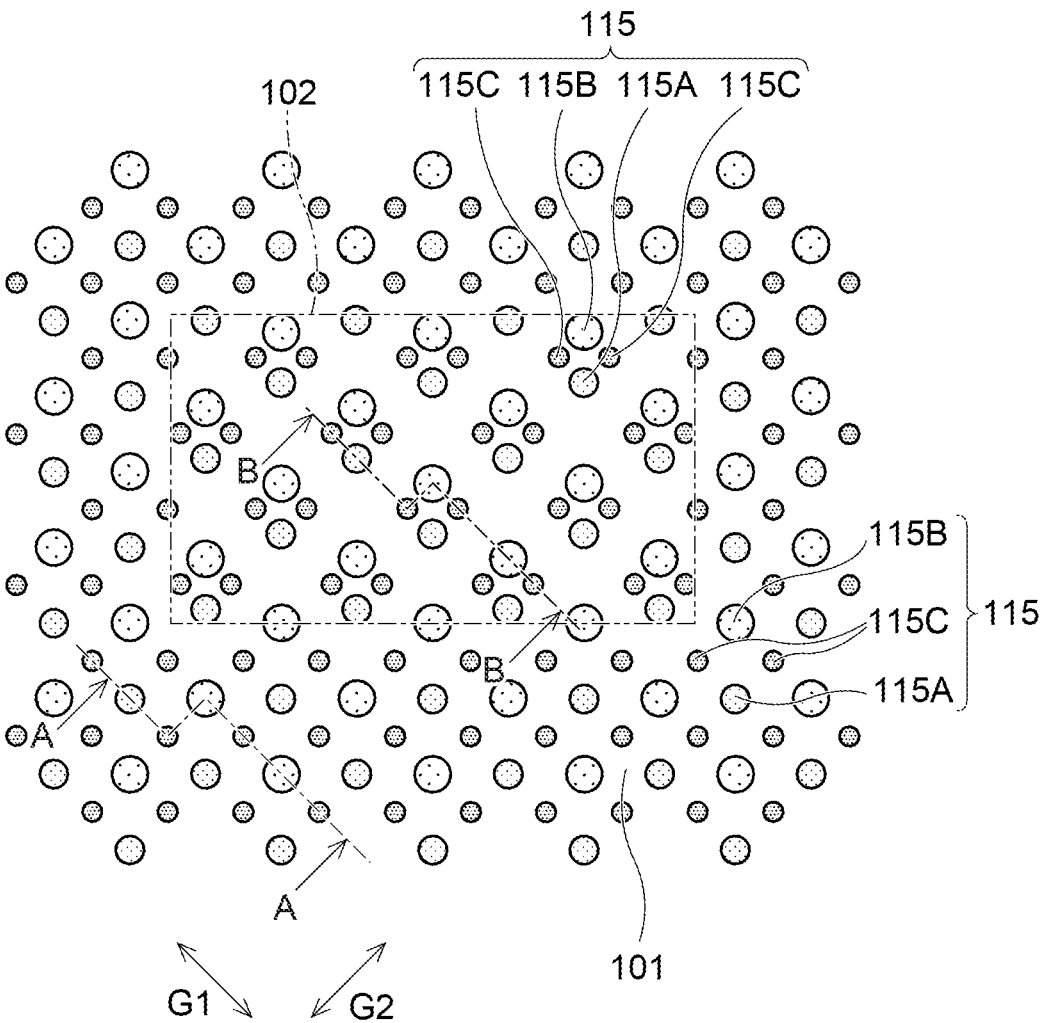
FIG. 2 is an enlarged plan view illustrating elements in a first display region and a second display region of the organic device.

FIG. 2 is a plan view illustrating the elements 115 in the first display region 101 and the second display region 102 in FIG. 1 in an enlarged manner. FIG. 2 illustrates the elements 115 in a state in which a second electrode 140, which will be described later, is omitted.

As illustrated in FIG. 2, the organic device 100 includes a plurality of the elements 115. One element 115 makes up one pixel. One element 115 may include one first element 115A, one second element 115б, and two third element 115C. The one first element 115A, one second element 115б, and two third element 115C that make up one elements 115 may be positioned at vertices of a regular quadrilateral. Such an array of the elements 115 is also referred to as a PenTile array.

In the description of the present specification, in a case of describing a configuration that is common to the first element 115A, the second element 115B, and the third element 115C, out of the configurations of the elements 115, the term and symbol "element 115" will be used. In plan view such as in FIG. 2, outlines of the elements 115A, 115B, and 115C may be, in plan view, outlines of color electrodes 120A-120C, which will be described later, or may be outlines of color organic layers 130A-130C that cover the color electrodes 120A-120C. In a case in which the organic device 100 includes an insulating layer 160 that will be described later, the outlines of the elements 115 may be portions of the organic layers 130 that do not overlap the insulating layer 160 in plan view.

The elements 115 may be arrayed in the first display region 101 and in the second display region 102 in a state of being inclined by 45°. The elements 115 are arrayed following an element first direction G1, and also are arrayed following an element second direction G2. The element second direction G2 may be a direction that is orthogonal to the element first direction G1. The element first direction G1 and the element second direction G2 may form an angle of 45° as to an outer contour 100a (see FIG. 1) of the organic device 100.

In the present embodiment, the pitch of the color electrodes 120A-120C making up one element 115 situated in the second display region 102 is smaller than a similar pitch situated in the first display region 101, which will be described later. On the other hand, a pixel density of the second display region 102 may be equal to a pixel density of the first display region 101. The pixel density is equivalent to the density of the elements 115.

Figure 3:
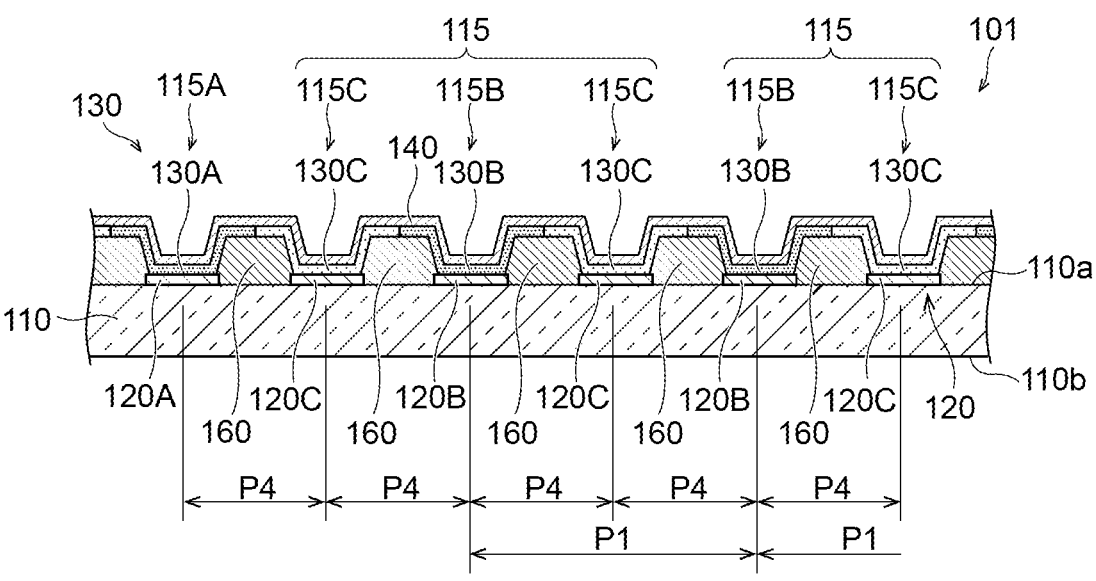
FIG. 3 is a cross-sectional view of the organic device in the first display region, and is a cross-sectional view taken along line A-A in FIG. 2.
Figure 4:
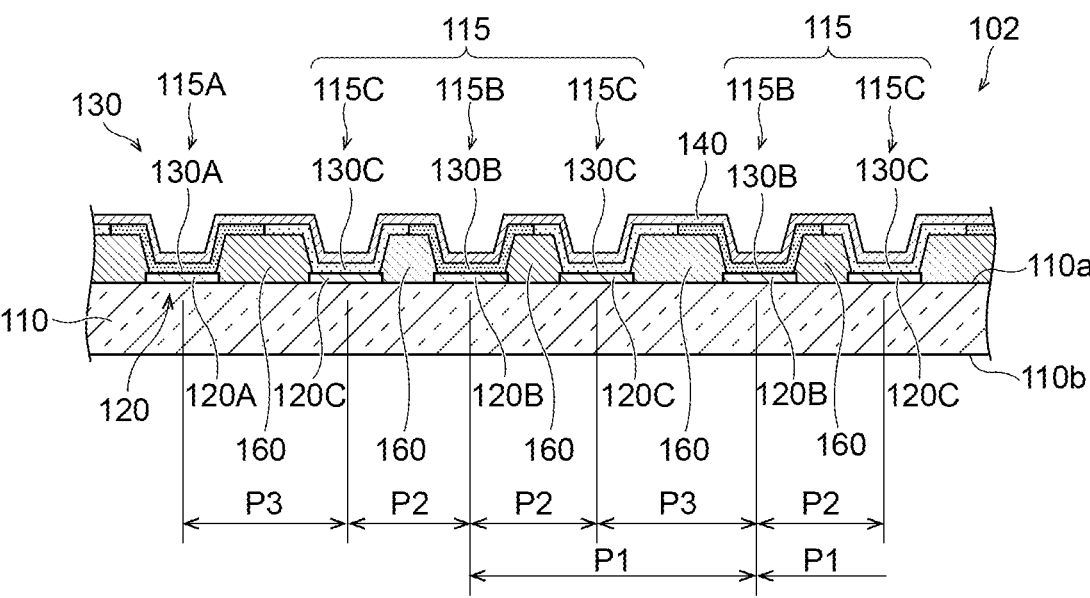
FIG. 4 is a cross-sectional view of the organic device in the second display region, and is a cross-sectional view taken along line B-B in FIG. 2.

The organic device 100 will be described in further detail with reference to FIG. 3 and FIG. 4. FIG. 3 is a cross-sectional view of the organic device 100 in the first display region 101, and is a cross-sectional view taken along line A-A in FIG. 2. FIG. 4 is a cross-sectional view of the organic device 100 in the second display region 102, and is a cross-sectional view taken along line B-B in FIG. 2.

As illustrated in FIG. 3, the organic device 100 includes the substrate 110, and the elements 115 situated on the substrate 110. The elements 115 may include the first electrodes 120 situated on the substrate 110, the organic layers 130 situated on the first electrodes 120, and the second electrode 140 situated on the organic layers 130. The organic layers 130 may cover the first electrodes 120 in plan view. The second electrode 140 may cover the first electrodes 120 in plan view.

The organic device 100 may include the insulating layer 160 situated between two of each of the color electrodes 120A-120C that are adjacent in plan view. The insulating layer 160 may include polyimide, for example. The insulating layer 160 may overlap end portions of the color electrodes 120A-120C.

The organic device 100 may be of an active matrix type. For example, the organic device 100 may include switches that are electrically connected to each of the plurality of elements 115, although not illustrated. The switches may be transistors, for example. The switches may control ON/OFF of voltage or current to corresponding elements 115.

The elements 115 may be configured to realize some sort of function by voltage being applied across the first electrodes 120 and the second electrode 140. Alternatively, the elements 115 may be configured to realize some sort of function by current flowing across the first electrodes 120 and the second electrode 140. For example, in a case in which the elements 115 are pixels of the organic device 100, light making up images and so forth may be discharged.

The configuration of the substrate 110 will be described.

The substrate 110 may include a first face 110a on which the elements 115 are situated, and a second face 110b situated on the opposite side from the first face 110a. The substrate 110 may be a plate-like member that has insulating properties. The substrate 110 may have light transmissivity to transmit visible light. For example, the substrate 110 may be a glass substrate.

In a case in which the substrate 110 has a predetermined light transmissivity, the light transmissivity of the substrate 110 may be light transmissivity by which light emitted from the organic layers 130 can be transmitted and displayed. For example, the transmissivity of the substrate 110 in a visible light region may be 70% or more, may be 80% or more, or may be 90% or more. The transmissivity of the substrate 110 may be transmissivity with respect to light having a wavelength of 550 nm. The transmissivity of the substrate 110 may be measured by a testing method of Plastics—Determination of the total luminous transmittance of transparent materials, conforming to JIS K7361-1.

The substrate 110 may have flexibility, or may have no flexibility. The material of the substrate 110 may be selected in accordance with the usage of the organic device 100.

The thickness of the substrate 110 may be selected as appropriate in accordance with the material used for the substrate 110 or the usage and so forth of the organic device 100. For example, the thickness of the substrate 110 may be 0.005 mm or more. The thickness of the substrate 110 may be 5 mm or less.

Figure 5:
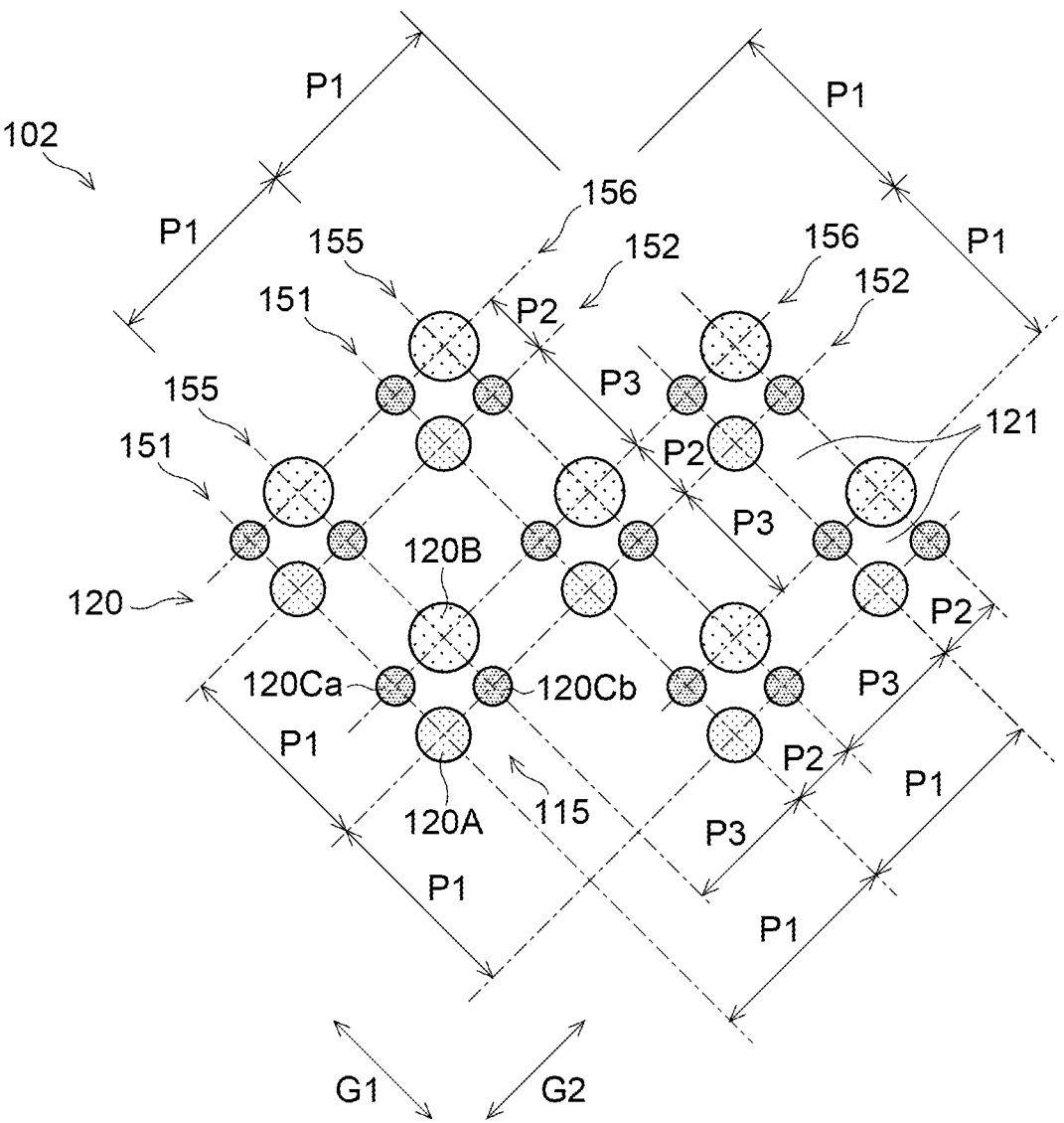
FIG. 5 is an enlarged plan view of FIG. 2, illustrating first electrodes in the second display region.
Figure 6:
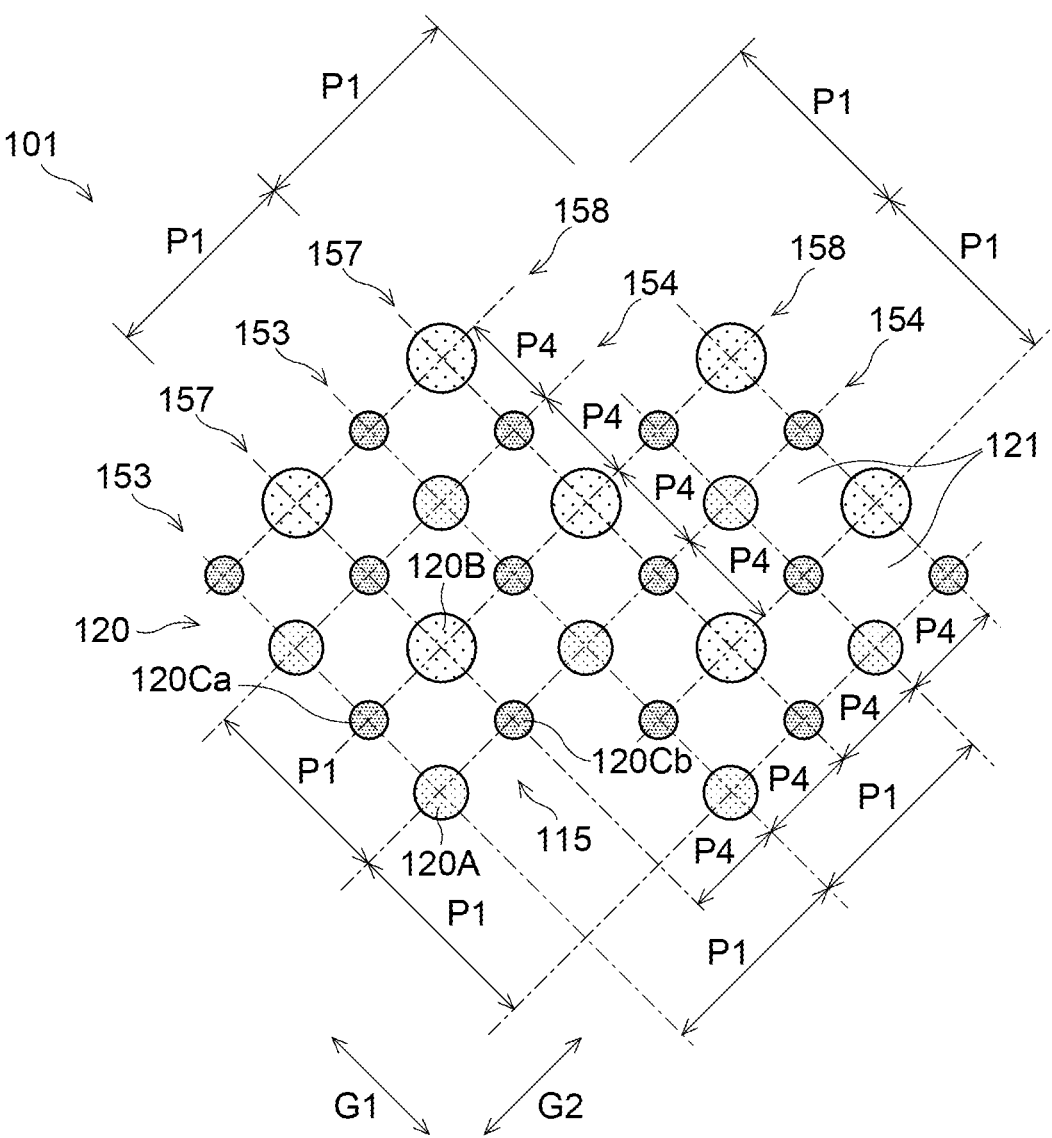
FIG. 6 is an enlarged plan view of FIG. 2, illustrating the first electrodes in the first display region.
Figure 7:
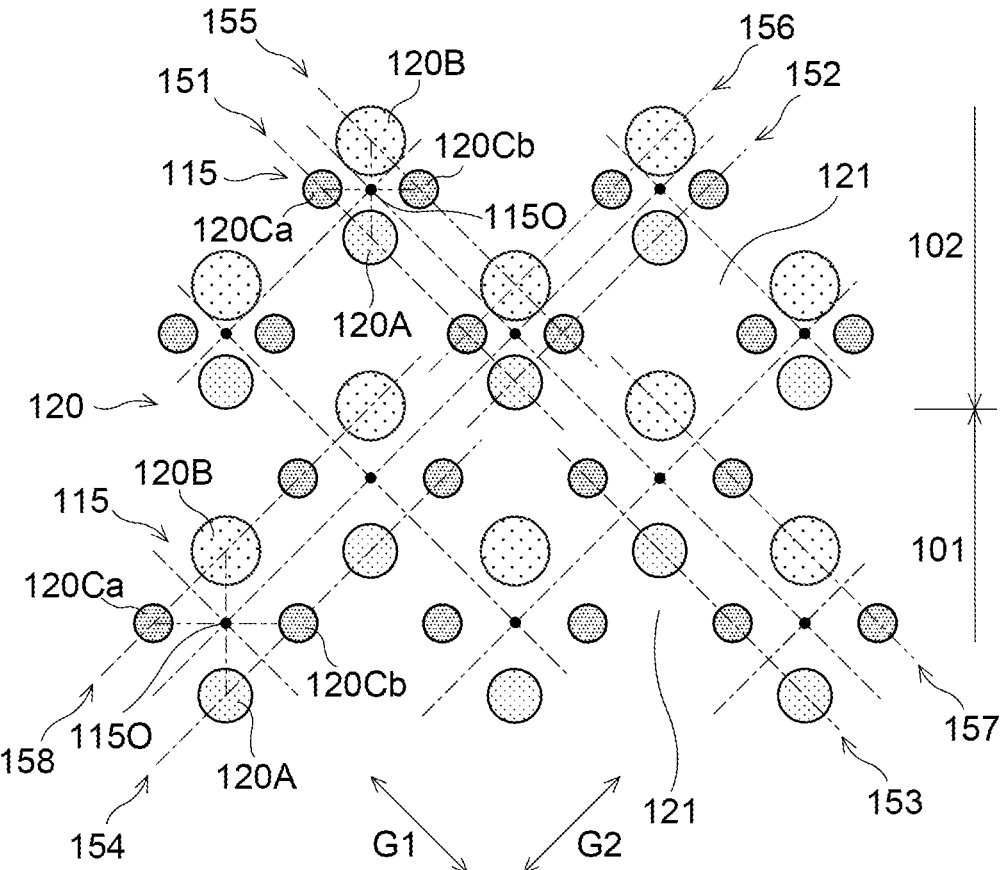
FIG. 7 is an enlarged plan view of FIG. 2, illustrating the first electrodes in the first display region and the second display region.

The configuration of the first electrodes 120 will be described with reference to FIG. 3-FIG. 7. FIG. 5 is an enlarged plan view illustrating the first electrodes 120 in the second display region 102, and FIG. 6 is an enlarged plan view illustrating the first electrodes 120 in the first display region 101. FIG. 7 is an enlarged plan view illustrating the first electrodes 120 in the first display region 101 and the second display region 102.

As illustrated in FIG. 3 and FIG. 4, the first electrodes 120 may include a plurality of electrodes. For example, the first electrodes 120 may include first color electrodes 120A, second color electrodes 120B, and third color electrodes 120C. One pixel or one element 115 may be made up of one first color electrode 120A, one second color electrode 120B, and two third color electrodes 120C. The first color electrodes 120A, the second color electrodes 120B, and the third color electrodes 120C may be formed by vapor deposition. More specifically, the first color electrodes 120A may be formed by vapor deposition, using a first mask 50A (see FIG. 11 and FIG. 15), which will be described later. The second color electrodes 120B may be formed by vapor deposition, using a second mask 50B (see FIG. 12 and FIG. 16), which will be described later. The third color electrodes 120C may be formed by vapor deposition, using a third mask 50C (see FIG. 13 and FIG. 17), which will be described later. In the description of the present specification, in a case of describing configurations of the first electrodes that are common to the first color electrodes 120A, the second color electrodes 120B, and the third color electrodes 120C, the term and symbol "first electrode 120" will be used.

The first color electrodes 120A may be covered, in plan view, with first color organic layers 130A that will be described later. The first color organic layers 130A may be red color light-emitting layers. The second color electrodes 120B may be covered, in plan view, with second color organic layers 130B that will be described later. The second color organic layers 130B may be blue color light-emitting layers. The third color electrodes 120C may be covered, in plan view, with third color organic layers 130C that will be described later. The third color organic layers 130C may be green color light-emitting layers.

As illustrated in FIG. 5-FIG. 7, the first color electrodes 120A, the second color electrodes 120B, and the third color electrodes 120C may have, in plan view, substantially circular outlines or substantially elliptic outlines, or may have substantially polygonal outlines. For example, the electrodes 120A-120C may have substantially quadrangular outlines, substantially hexagonal outlines, or substantially octagonal outlines. In the examples illustrated in FIG. 5-FIG. 7, the color electrodes 120A-120C have substantially circular outlines. The diameter of the second color electrodes 120B may be larger than the diameter of the first color electrodes 120A. The diameter of the third color electrodes 120C may be smaller than the diameter of the first color electrodes 120A.

Non-electrode regions 121 may be formed around each of the first electrodes 120 situated in the second display region 102. More specifically, the non-electrode regions 121 are regions formed around the color electrodes 120A-120C, and are regions in which the color electrodes 120A-120C are not formed. Light arriving at the second display region 102 of the organic device 100 can primarily arrive at optical parts and so forth situated on the rear side of the substrate 110, by passing through the non-electrode regions 121. The non-electrode regions 121 may also be formed around the first electrodes 120 situated in the first display region 101 as well.

The positional relation of the first color electrodes 120A, the second color electrodes 120B, and the third color electrodes 120C will be described. In the present embodiment, the pitch of the color electrodes 120A-120C making up one element 115 situated in the second display region 102 is smaller. This will be described below.

As illustrated in FIG. 5, in the second display region 102, the first color electrodes 120A may be arrayed following the element first direction G1, and may be arrayed following the element second direction G2. The pitch of the first color electrodes 120A following the element first direction G1 may be a first pitch P1. The pitch of the first color electrodes 120A following the element second direction G2 may be the first pitch P1. The first color electrodes 120A situated in the second display region 102 may be arrayed equidistantly following each of the element first direction G1 and the element second direction G2.

As illustrated in FIG. 6, in the first display region 101, the first color electrodes 120A may be arrayed following the element first direction G1, and may be arrayed following the element second direction G2. The pitch of the first color electrodes 120A following the element first direction G1 may be the first pitch P1. The pitch of the first color electrodes 120A following the element second direction G2 may be the first pitch P1. The first color electrodes 120A situated in the first display region 101 may be arrayed equidistantly following each of the element first direction G1 and the element second direction G2.

As illustrated in FIG. 5, in the second display region 102, the second color electrodes 120B may be arrayed following the element first direction G1, and may be arrayed following the element second direction G2. The pitch of the second color electrodes 120B following the element first direction G1 may be the first pitch P1, and may be equal to the pitch of the first color electrodes 120A. The pitch of the second color electrodes 1206 following the element second direction G2 may be the first pitch P1, and may be equal to the pitch of the first color electrodes 120A. The second color electrodes 1206 situated in the second display region 102 may be arrayed equidistantly following each of the element first direction G1 and the element second direction G2.

As illustrated in FIG. 6, in the first display region 101, the second color electrodes 120B may be arrayed following the element first direction G1, and may be arrayed following the element second direction G2. The pitch of the second color electrodes 120B following the element first direction G1 may be the first pitch P1, and may be equal to the pitch of the first color electrodes 120A. The pitch of the second color electrodes 1206 following the element second direction G2 may be the first pitch P1, and may be equal to the pitch of the first color electrodes 120A. The second color electrodes 1206 situated in the first display region 101 may be arrayed equidistantly following each of the element first direction G1 and the element second direction G2.

As illustrated in FIG. 5 and FIG. 6, in each of the first display region 101 and the second display region 102, the third color electrodes 120C may be arrayed following the element first direction G1, and may be arrayed following the element second direction G2. The two third color electrodes 120C making up one element 115 may include one third color electrode 120Ca and one third color electrode 120Cb. In the description of the present specification, in a case of describing configurations of the third color electrodes 120C that are common to the third color electrodes 120Ca and the third color electrodes 120Cb, the term and symbol "third color electrodes 120C" will be used.

The third color electrodes 120Ca and the third color electrodes 120Cb form arrays following the element first direction G1, parallel to each other. The pitch of the third color electrodes 120Ca following the element first direction G1 may be the first pitch P1, and may be equal to the pitch of the first color electrodes 120A. The pitch of the third color electrodes 120Cb following the element first direction G1 may be the first pitch P1, and may be equal to the pitch of the first color electrodes 120A.

The third color electrodes 120Ca and the third color electrodes 120Cb form arrays following the element second direction G2, parallel to each other. The pitch of the third color electrodes 120Ca following the element second direction G2 may be the first pitch P1, and may be equal to the pitch of the first color electrodes 120A. The pitch of the third color electrodes 120Cb following the element second direction G2 may be the first pitch P1, and may be equal to the pitch of the first color electrodes 120A.

As illustrated in FIG. 5 and FIG. 6, in each of the first display region 101 and the second display region 102, the first color electrodes 120A and the third color electrodes 120C may be arrayed in an alternating manner following the element first direction G1, and may be arrayed in an alternating manner following the element second direction G2.

As illustrated in FIG. 5, the first color electrodes 120A and the third color electrodes 120Ca situated in the second display region 102 may make up a first electrode array 151 following the element first direction G1. A plurality of the first electrode arrays 151 may be formed in the second display region 102. The first color electrodes 120A and the third color electrodes 120Cb situated in the second display region 102 may make up a second electrode array 152 following the element second direction G2. A plurality of the second electrode arrays 152 may be formed in the second display region 102.

The first color electrodes 120A and the third color electrodes 120C situated in the second display region 102 may be arrayed so as to alternate between a second pitch P2 and a third pitch P3, following each of the element first direction G1 and the element second direction G2. The pitch of the first color electrodes 120A and the third color electrodes 120Ca that make up one element 115 in the first electrode array 151 described above may be the second pitch P2. Of two elements 115 that are adjacent in a first electrode array 151, the pitch of a first color electrode 120A making up one of the elements 115 and a third color electrode 120Ca making up the other of the elements 115 may be the third pitch P3. The pitch of the first color electrodes 120A and the third color electrodes 120Cb that make up one element 115 in the second electrode array 152 described above may be the second pitch P2. Of two elements 115 that are adjacent in a second electrode array 152, the pitch of a first color electrode 120A making up one of the elements 115 and a third color electrode 120Cb making up the other of the elements 115 may be the third pitch P3. The sum of the second pitch P2 and the third pitch P3 is equal to the first pitch P1 that is described above. The second pitch P2 may be different from the third pitch P3. The second pitch P2 may be smaller than the third pitch P3. The second pitch P2 may be smaller than half of the first pitch P1.

The proportion of the second pitch P2 as to the third pitch P3 may be, for example, 0.50 or more, 0.51 or more, or 0.52 or more. Making the proportion to be 0.50 or more enables distance among the color electrodes 120A-120C to be secured, and occurrence of color mixing to be suppressed. The proportion may be, for example, 0.66 or less, 0.68 or less, or 0.70 or less. Making the proportion to be 0.70 or less enables regularity of the layout of the color electrodes 120A-120C to be effectively reduced. The range of proportion may be set by a first group made up of 0.50, 0.51, and 0.52, and/or a second group made up of 0.66, 0.68, and 0.70. The range of proportion may be determined by a combination of any one of values included in the first group described above, and of any one of values included in the second group described above. The range of proportion may be determined by a combination of any two of values included in the first group described above. The range of proportion may be determined by a combination of any two of values included in the second group described above. For example, the range of proportion may be 0.50 or more and 0.70 or less, may be 0.50 or more and 0.68 or less, may be 0.50 or more and 0.66 or less, may be 0.50 or more and 0.52 or less, may be 0.50 or more and 0.51 or less, may be 0.51 or more and 0.70 or less, may be 0.51 or more and 0.68 or less, may be 0.51 or more and 0.66 or less, may be 0.51 or more and 0.52 or less, may be 0.52 or more and 0.70 or less, may be 0.52 or more and 0.68 or less, may be 0.52 or more and 0.66 or less, may be 0.66 or more and 0.70 or less, may be 0.66 or more and 0.68 or less, or may be 0.68 or more and 0.70 or less.

As illustrated in FIG. 6, the first color electrodes 120A and the third color electrodes 120Ca situated in the first display region 101 may make up a third electrode array 153 following the element first direction G1. A plurality of the third electrode arrays 153 may be formed in the first display region 101. The first color electrodes 120A and the third color electrodes 120Cb situated in the first display region 101 may make up a fourth electrode array 154 following the element second direction G2. A plurality of the fourth electrode arrays 154 may be formed in the first display region 101.

The first color electrodes 120A and the third color electrodes 120C situated in the first display region 101 may be arrayed at a fourth pitch P4 following each of the element first direction G1 and the element second direction G2. In the third electrode array 153 described above, the pitch of the first color electrodes 120A and the third color electrodes 120Ca may be the fourth pitch P4. In the fourth electrode array 154 described above, the pitch of the first color electrodes 120A and the third color electrodes 120Cb may be the fourth pitch P4. The first color electrodes 120A and the third color electrodes 120C situated in the first display region 101 may be arrayed equidistantly following each of the element first direction G1 and the element second direction G2. The fourth pitch P4 may be half of the first pitch P1. The fourth pitch P4 may be larger than the second pitch P2, and may be smaller than the third pitch P3.

As illustrated in FIG. 5 and FIG. 6, in each of the first display region 101 and the second display region 102, the second color electrodes 120B and the third color electrodes 120C may be arrayed in an alternating manner following the element first direction G1, and may be arrayed in an alternating manner following the element second direction G2.

As illustrated in FIG. 5, the second color electrodes 120B and the third color electrodes 120Cb situated in the second display region 102 may make up a fifth electrode array 155 following the element first direction G1. A plurality of the fifth electrode arrays 155 may be formed in the second display region 102. The second color electrodes 120B and the third color electrodes 120Ca situated in the second display region 102 may make up a sixth electrode array 156 following the element second direction G2. A plurality of the sixth electrode arrays 156 may be formed in the second display region 102.

The second color electrodes 120B and the third color electrodes 120C situated in the second display region 102 may be arrayed so as to alternate between the second pitch P2 and the third pitch P3, following each of the element first direction G1 and the element second direction G2. The pitch of the second color electrode 120B and the third color electrode 120Cb making up one element 115 in the fifth electrode array 155 described above may be the second pitch P2. Of two elements 115 that are adjacent in the fifth electrode array 155, the pitch of a second color electrode 120B making up one of the elements 115 and a third color electrode 120Cb making up the other of the elements 115 may be the third pitch P3. The pitch of the second color electrode 120B and the third color electrode 120Ca making up one element 115 in the sixth electrode array 156 described above may be the second pitch P2. Of two elements 115 that are adjacent in a sixth electrode array 156, the pitch of a second color electrode 120B making up one of the elements 115 and a third color electrode 120Ca making up the other of the elements 115 may be the third pitch P3.

As illustrated in FIG. 6, the second color electrodes 120B and the third color electrodes 120Cb situated in the first display region 101 may make up a seventh electrode array 157 following the element first direction G1. A plurality of the seventh electrode arrays 157 may be formed in the first display region 101. The second color electrodes 120B and the third color electrodes 120Ca situated in the first display region 101 may make up an eighth electrode array 158 following the element second direction G2. A plurality of the eighth electrode arrays 158 may be formed in the first display region 101.

The second color electrodes 120B and the third color electrodes 120C situated in the first display region 101 may be arrayed at the fourth pitch P4 following each of the element first direction G1 and the element second direction G2. In the seventh electrode array 157 described above, the pitch of the second color electrodes 120B and the third color electrodes 120Cb may be the fourth pitch P4. In the eighth electrode array 158 described above, the pitch of the second color electrodes 120B and the third color electrodes 120Ca may be the fourth pitch P4.

As illustrated in FIG. 7, the elements 115 situated in the first display region 101 and the elements 115 situated in the second display region 102 may be arrayed following the element first direction G1, and may be arrayed following the element second direction G2. More specifically, centers 1150 of the elements 115 situated in the first display region 101 and centers 1150 of the elements 115 situated in the second display region 102 may be arrayed following the element first direction G1, and may be arrayed following the element second direction G2. The centers 1150 of the elements 115 situated in the second display region 102 may be situated on extension lines of arrays of the centers 1150 of the elements 115 situated in the first display region 101, following each of the element first direction G1 and the element second direction G2. The centers 1150 of the elements 115 may be intersections between line segments connecting centers of the first color electrodes 120A and centers of the second color electrodes 120B, and line segments connecting centers of the third color electrodes 120Ca and centers of the third color electrodes 120Cb. In this case, the centers 1150 of the elements 115 are situated at intermediate positions between the centers of the first color electrodes 120A and the centers of the second color electrodes 120B, and are also situated at intermediate positions between the centers of the third color electrodes 120Ca and the centers of the third color electrodes 120Cb.

As illustrated in FIG. 7, the first electrode arrays 151 described above may be offset from the third electrode arrays 153 described above, in the element second direction G2. The second electrode arrays 152 described above may be offset from the fourth electrode arrays 154 described above, in the element first direction G1. The fifth electrode arrays 155 described above may be offset from the seventh electrode arrays 157 described above, in the element second direction G2. The sixth electrode arrays 156 described above may be offset from the eighth electrode arrays 158 described above, in the element first direction G1.

The configuration of the organic layers 130 will be described below with reference to FIG. 3 and FIG. 4.

The organic layers 130 illustrated in FIG. 3 and FIG. 4 may contain an organic material. The organic layers 130 can exhibit some sort of function by the organic layers 130 carrying electricity. To carry electricity means that voltage is applied to the organic layers 130, or that current flows through the organic layers 130. The organic layers 130 may be light-emitting layers that discharge light upon carrying electricity, layers in which transmissivity or refractive index of light changes upon carrying electricity, or the like. The organic layers 130 may contain organic semiconductor material.

As illustrated in FIG. 3 and FIG. 4, the organic layers 130 may include first color organic layers 130A, second color organic layers 1306, and third color organic layers 130C. The color organic layers 130A-130C may be formed by vapor deposition, using a vapor deposition mask 20 according to the present embodiment. For example, the first color organic layers 130A may be situated on the first color electrodes 120A, and may be red color light-emitting layers. For example, the second color organic layers 130B may be situated on the second color electrodes 120B, and may be blue color light-emitting layers. For example, the third color organic layers 130C may be situated on the third color electrodes 120C, and may be green color light-emitting layers. For example, through holes of the mask used for forming the first color organic layers 130A may be formed so as to correspond to a pattern of the first color organic layers 130A. Through holes of the mask used for forming the second color organic layers 130B may be formed so as to correspond to a pattern of the second color organic layers 1306. Through holes of the mask used for forming the third color organic layers 130C may be formed so as to correspond to a pattern of the third color organic layers 130C. In the description of the present specification, in a case of describing a configuration that is common to the first color organic layers 130A, the second color organic layers 1306, and the third color organic layers 130C, out of the configurations of the organic layers, the term and symbol "organic layer 130" will be used.

The configuration of the second electrode 140 will be described with reference to FIG. 3 and FIG. 4.

As illustrated in FIG. 3 and FIG. 4, the second electrode 140 may cover the first color organic layers 130A, the second color organic layers 130B, and the third color organic layers 130C, in plan view. The second electrode 140 may be formed so as to straddle the first color organic layers 130A, the second color organic layers 1306, and the third color organic layers 130C. The second electrode 140 may be formed continuously over the entirety of the organic layers 130. However, this is not limiting, and the second electrode 140 may be formed in a pattern corresponding to the elements 115a, 1156, and 115C. In this case, the second electrode 140 may include a plurality of layers. Each layer of the second electrode 140 may be formed in a pattern so as to cover at least one of the first color organic layers 130A, the second color organic layers 1306, and the third color organic layers 130C in plan view, with the layers of the second electrode 140 partially overlapping each other.

The first elements 115A described above may include the first color electrodes 120A, the first color organic layers 130A, and the second electrode 140. In a case in which the second electrode 140 is formed in a pattern so as to correspond to the elements 115A, 1158, and 115C, the layers of the second electrode 140 that are situated on the first color organic layers 130A may make up the first elements 115A. The second elements 1158 may include the second color electrodes 1208, the second color organic layers 1308, and the second electrode 140. In a case in which the second electrode 140 is formed in a pattern so as to correspond to the elements 115A, 1158, and 115C, the layers of the second electrode 140 that are situated on the second color organic layers 130B may make up the second elements 1158. The third elements 115C may include the third color electrodes 120C, the third color organic layers 130C, and the second electrode 140. In a case in which the second electrode 140 is formed in a pattern so as to correspond to the elements 115A, 1158, and 115C, the layers of the second electrode 140 that are situated on the third color organic layers 130C may make up the third elements 115C. The first elements 115A, the second elements 1158, and the third elements 115C are each sub-pixels. One pixel may be made up of a combination of one first element 115A, one second element 115B, and two third elements 115C.

When voltage is applied across the first electrodes 120 and the second electrode 140, the organic layers 130 situated therebetween are driven. In a case in which the organic layers 130 are light-emitting layers, light is discharged from the organic layers 130, and the light passes through the second electrode 140 to the outside, or passes through the first electrodes 120 to the outside.

In a case in which the organic layers 130 are light-emitting layers that discharge light by carrying electricity, the organic layers 130 may include hole injection layers, hole transporting layers, electron transporting layers, electron injection layers, and so forth.

For example, in a case in which the first electrodes 120 are anodes, the organic layers 130 may have hole injection/transporting layers between the light-emitting layer and the first electrodes 120. The hole injection/transporting layers may be hole injection layers having hole injection functions. Alternatively, the hole injection/transporting layers may be hole transporting layers having hole transporting functions, or may have both functions of hole injection functions and hole transporting functions. The hole injection/transporting layers may have configurations in which hole injection layers and hole transporting layers are stacked.

In a case in which the second electrode 140 is a cathode, the organic layers 130 may have electron injection/transporting layers between the light-emitting layers and the second electrode 140. The electron injection/transporting layers may be electron injection layers having electron injection functions. Alternatively, the electron injection/transporting layers may be electron transporting layers having electron transporting functions, or may have both functions of electron injection functions and electron transporting functions. The electron injection/transporting layers may have configurations in which electron injection layers and electron transporting layers are stacked.

The first electrodes 120 contain a material having conductivity. For example, the first electrodes 120 may include metals, metal oxides having conductivity, other inorganic materials having conductivity, or the like. The first electrodes 120 may contain metal oxides having light transmissivity and conductivity, such as indium tin oxide or the like. Indium tin oxide that is referred to as ITO, indium zinc oxide that is referred to as IZO, or the like, may be used as materials for making the first electrodes 120.

In a case in which the organic layers 130 are light-emitting layers, the organic layers 130 contain a light-emitting material. The light-emitting layers may contain an additive to improve leveling. Known materials may be used for the light-emitting material. For example, color-matter-based materials, metal-complex-based materials, or polymer-based materials, may be used as the light-emitting material.

The second electrode 140 contains a material having conductivity, such as metal and so forth. The second electrode 140 may be formed on the organic layers 130. Platinum, gold, silver, copper, iron, tin, chromium, aluminum, indium, lithium, sodium, potassium, calcium, magnesium, chromium, carbon, or the like, may be used as materials making up the second electrode 140. This conductive materials may be used alone, or two or more types of materials may be used in combination. In a case of using two or more types of materials, layers made of each of the materials may be stacked. Alloys containing two or more types of materials may be used as the conductive material. For example, magnesium alloys such as MgAg or the like, aluminum alloys such as AlLi, AlCa, AlMg, or the like, alloys of alkaline metals or alkaline earth metals, or the like, may be used as the conductive material. Indium tin oxide that is referred to as ITO, indium zinc oxide that is referred to as IZO, or the like, may be used as materials for making the second electrode 140.

The organic device 100 may include a sealing layer (not illustrated) that covers components on the substrate 110, such as the organic layers 130 and so forth. The sealing layer can suppress water vapor and so forth outside of the organic device 100 from entering into the organic device 100. Accordingly, the organic layers 130 and so forth can be suppressed from deteriorating due to moisture. The sealing layer may include a layer made of an organic material, for example. The organic material may have a refractive index that is equal to that of the organic layers 130, or may have a refractive index that is close to that of the organic layers 130, in order to suppress refraction of light from occurring at the sealing layer. The organic material may be sealed by an inorganic material such as silicon nitride (SiN) or the like, for example. In this case, the sealing layer may have a stacked structure in which a layer of organic material and a layer of inorganic material are stacked. A planarization layer (not illustrated) may be interposed between the second electrode 140 and the sealing layer. The planarization layer may be a layer that enters into uneven portions of the components on the substrate 110, in order to improve adhesion of the sealing layer.

The positions of the first electrodes 120 and the organic layers 130 in plan view can be detected by observation of the organic device 100 using a high-powered digital microscope. On the basis of detection results, dimensions of the first electrodes 120 and the organic layers 130 can be calculated, and also, the pitches of the first electrodes 120 described above can be calculated. In a case in which the substrate 110 has a desired translucency, the pitches of the color electrodes 120A-120C of the first electrodes 120 can be calculated by observation through the substrate 110. In a case in which the substrate 110 does not have the desired translucency, the pitches of the color electrodes 120A-120C can be calculated by observation of the first electrodes 120 following removing the second electrode 140 and the organic layers 130.

Figure 8:
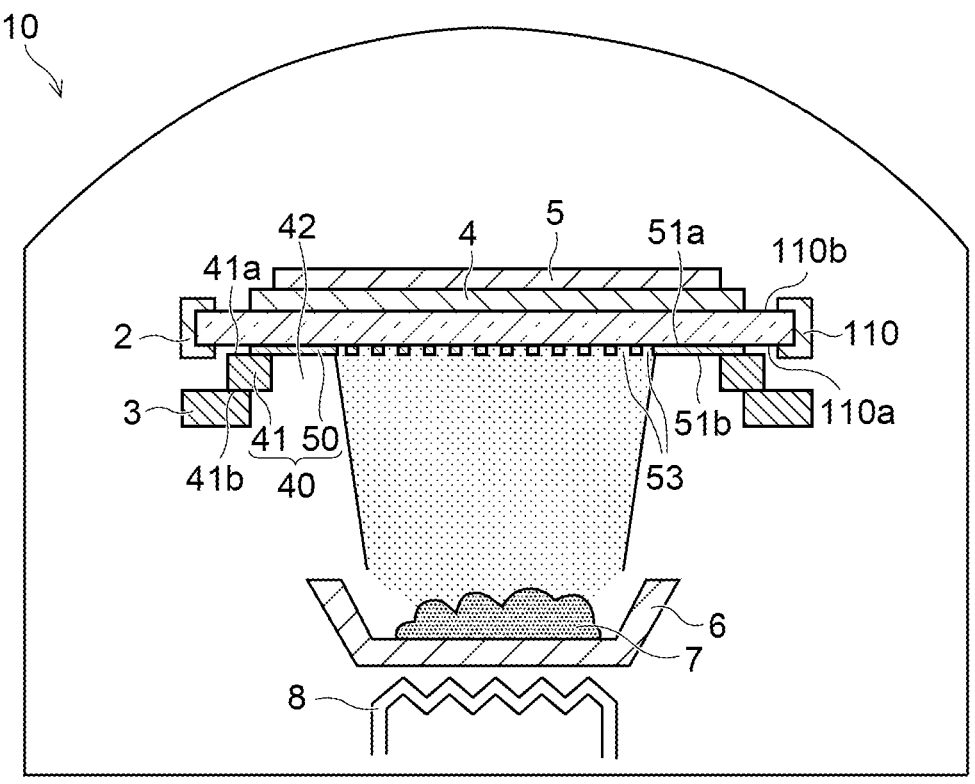
FIG. 8 is a diagram illustrating an example of a vapor deposition device having a mask device.

A method of forming the first electrodes 120 of the organic device 100 described above by vapor deposition will be described with reference to FIG. 8. FIG. 8 is a diagram illustrating a vapor deposition device 10. The vapor deposition device 10 carries out vapor deposition processing, in which vapor deposition of vapor deposition material onto an object is performed.

The vapor deposition device 10 may include a vapor deposition source 6, a heater 8, and a mask device 40. The vapor deposition device 10 may include evacuating means for drawing the inside of the vapor deposition device 10 to a vacuum atmosphere. A vapor deposition source 6 is a crucible, for example. The vapor deposition source 6 accommodates a vapor deposition material 7 such as a conductive material or the like. The heater 8 heats the vapor deposition source 6 to cause the vapor deposition material 7 to be vaporized under the vacuum atmosphere. The mask device 40 is disposed so as to face the crucible 6.

As illustrated in FIG. 8, the mask device 40 may include at least one mask 50, and a frame 41 supporting the mask 50. The frame 41 may include a first frame face 41a and a second frame face 41b. The mask 50 may be fixed to the first frame face 41a. The second frame face 41b is situated on the opposite side from the first frame face 41a. The frame 41 may include a frame opening 42. The frame opening 42 passes through from the first frame face 41a to the second frame face 41b. The mask 50 may be fixed to the frame 41 so as to cut across the frame opening 42 in plan view. The frame 41 may support the mask 50 in a state of being tensioned in a direction following the first frame face 41a. Thus, flexing of the mask 50 can be suppressed.

The first mask 50A, the second mask 50B, and the third mask 50C, which will be described later may be used as the mask 50. In the description of the present specification, in a case of describing a configuration that is common to the first mask 50A, the second mask 50B, and the third mask 50C, the term and symbol "mask 50" will be used. In this case, mask components such as through holes, shielding regions, and so forth, which will be described later, will also be denoted only by numerals such as "53", "54", or the like, which are numeral-only symbols with no alphabetic letters appended. On the other hand, in cases of describing contents that are features of the first mask 50A, the second mask 50B, and the third mask 50C, respectively, symbols with corresponding alphabetic letters, such as "A", "B", "C", or the like, appended to the numerals may be used.

The mask 50 of the mask device 40 faces the first face 110a of the substrate 110. The substrate 110 is the object on which the vapor deposition material 7 is to be applied by using the mask 50. The mask 50 includes a plurality of through holes 53. The through holes 53 allow the vapor deposition material 7 drifting from the vapor deposition source 6 to pass therethrough. The vapor deposition material 7 passing through the through holes 53 adheres to the first face 110a of the substrate 110. The mask 50 includes a first face 51a and a second face 51b. The first face 51a faces the first face 110a. The second face 51b is situated on the opposite side from the first face 51a, and faces the first frame face 41a of the frame 41. The through holes 53 pass through from the first face 51a to the second face 51b.

The vapor deposition device 10 may include a substrate holder 2 that holds the substrate 110. The substrate holder 2 may be capable of movement in a thickness direction of the substrate 110. The substrate holder 2 may be capable of movement in a direction following the first face 110a of the substrate 110. The substrate holder 2 may be capable of changing tilt of the substrate 110. For example, the substrate holder 2 may include a plurality of chucks that hold an outer edge of the substrate 110. Each chuck may be capable of independently moving in the thickness direction of the substrate 110 and in the direction following the first face 110a of the substrate 110.

The vapor deposition device 10 may include a mask holder 3 that holds the mask device 40. The mask holder 3 may be capable of movement in a thickness direction of the mask 50. The mask holder 3 may be capable of movement in a direction following the first face 51a of the mask 50. For example, the mask holder 3 may include a plurality of chucks that hold an outer edge of the frame 41. Each chuck may be capable of independently moving in the thickness direction of the mask 50 and in the direction following the first face 51a thereof.

The position of the mask 50 of the mask device 40 as to the substrate 110 can be adjusted by moving at least one of the substrate holder 2 and the mask holder 3.

The vapor deposition device 10 may include a cooling plate 4. The cooling plate 4 may face the second face 110b of the substrate 110. The cooling plate 4 may have a channel for circulating coolant within the cooling plate 4. The cooling plate 4 can suppress temperature of the substrate 110 from rising during a vapor deposition process.

The vapor deposition device 10 may include a magnet 5 that faces the second face 110b across the cooling plate 4. The magnet 5 may be laid upon the cooling plate 4. The magnet 5 attracts the mask 50 to the substrate 110 by magnetic force. Accordingly, a gap between the mask 50 and the substrate 110 can be reduced, or the gap can be eliminated. Thus, occurrence of shadows during the vapor deposition process can be suppressed. Accordingly, dimensional precision and positional precision of the first electrodes 120 can be raised. Alternatively, the mask 50 may be attracted to the substrate 110 using an electrostatic chuck that uses electrostatic force, instead of the magnet 5.

Figure 9:
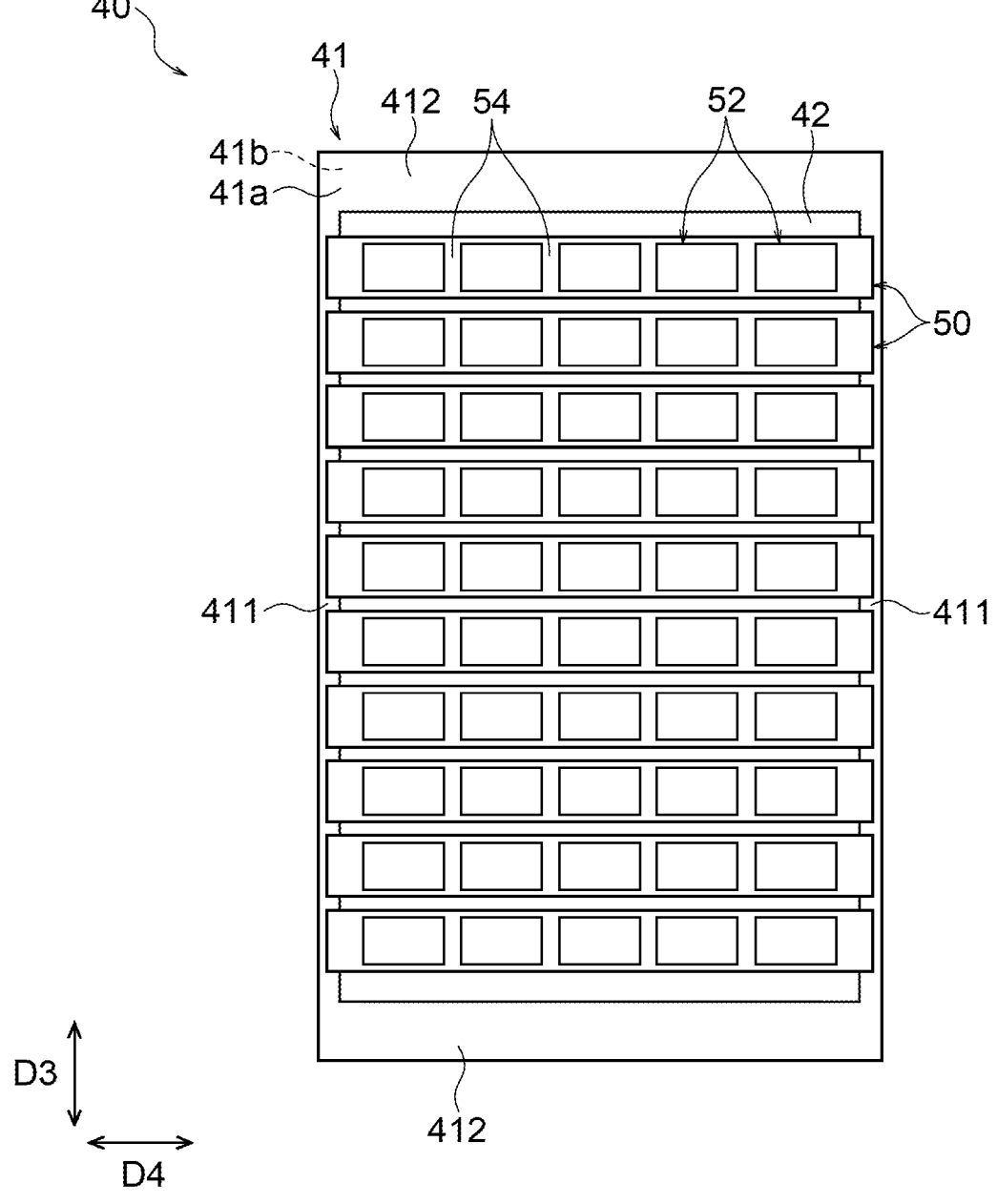
FIG. 9 is a plan view illustrating an example of the mask device illustrated in FIG. 8.

The mask device 40 will be described. FIG. 9 is a plan view illustrating the mask device 40. The mask device 40 may include two or more masks 50. The mask 50 may be fixed to the frame 41 by welding, for example.

The frame 41 includes a pair of first sides 411 and a pair of second sides 412. The frame 41 may have a rectangular outline. The mask 50 in a state in which tension is applied thereto may be fixed to the first sides 411. The first sides 411 may be longer than the second sides 412. The pair of first sides 411 and the pair of second sides 412 may surround the frame opening 42.

The material making up the frame 41 may be the same as the material of the mask 50, which will be described later. For example, an iron alloy containing nickel may be used as the material making up the frame 41.

Figure 10:
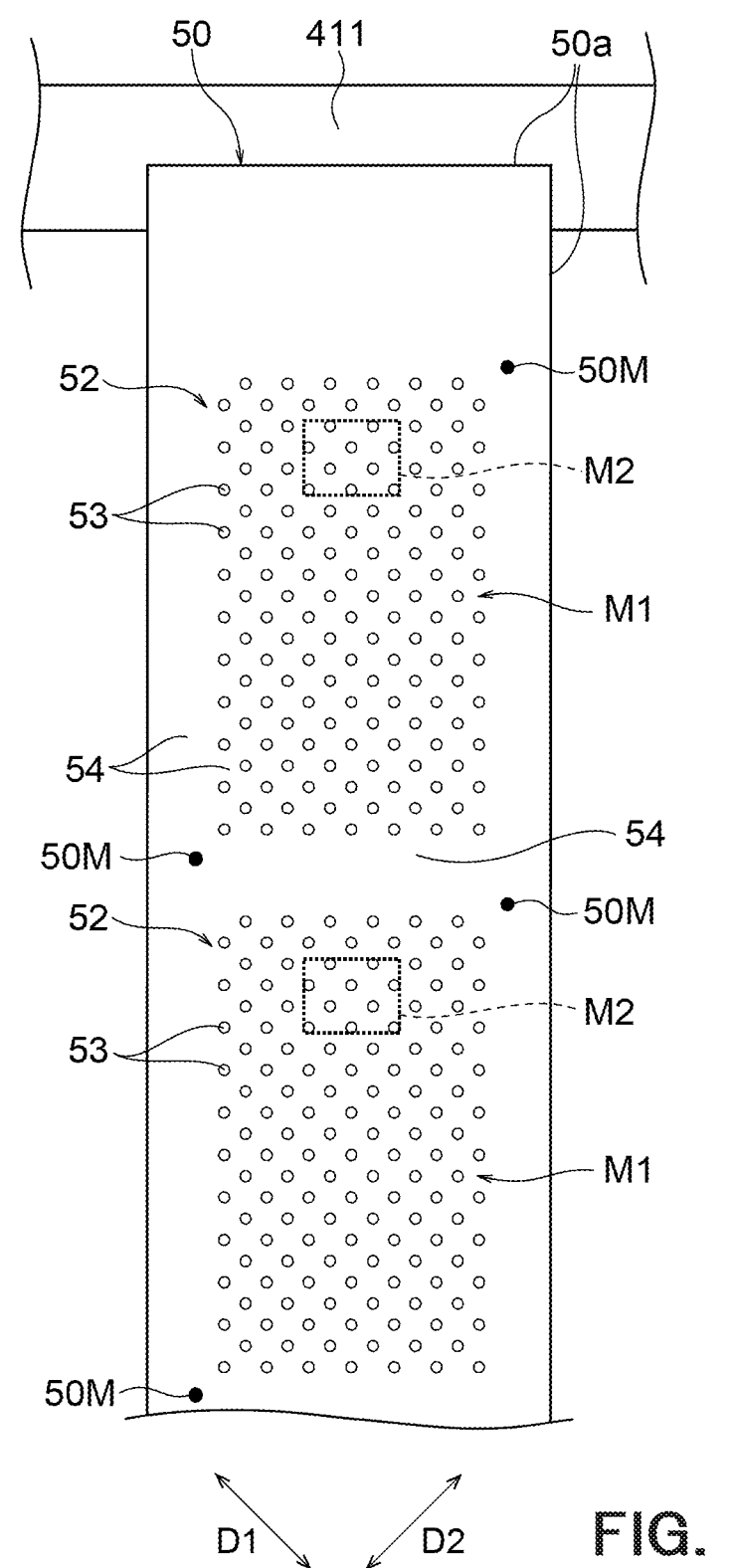
FIG. 10 is a plan view illustrating an example of a mask of the mask device illustrated in FIG. 9.
Figure 11:
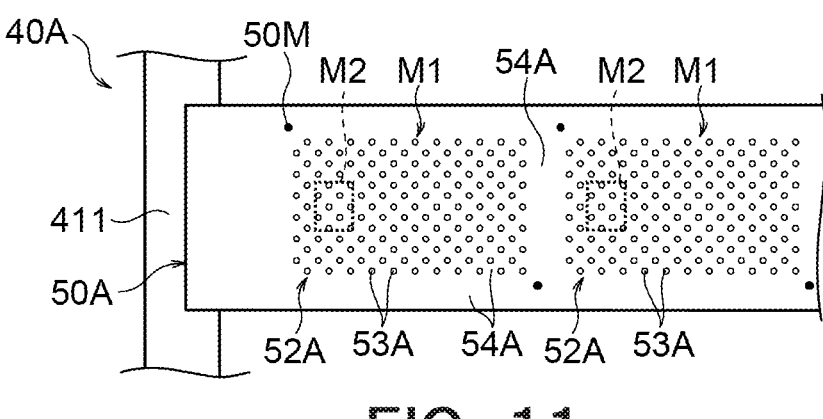
FIG. 11 is a plan view illustrating a first mask device.
Figure 12:
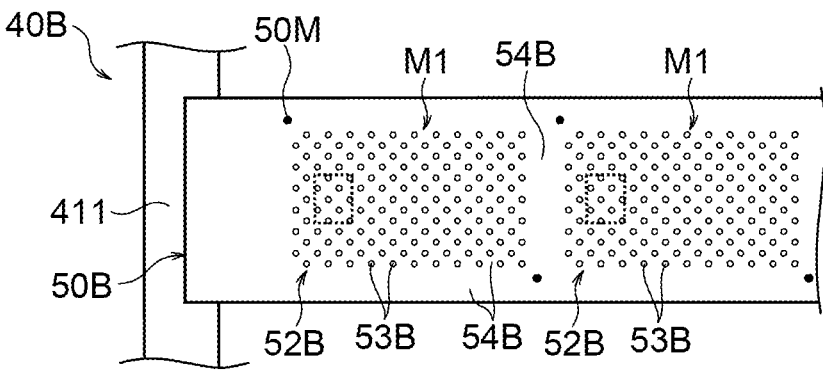
FIG. 12 is a plan view illustrating a second mask device.
Figure 13:
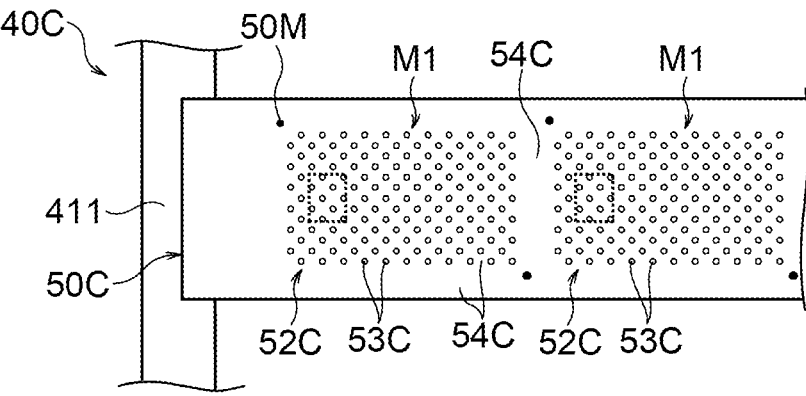
FIG. 13 is a plan view illustrating a third mask device.
Figure 14:
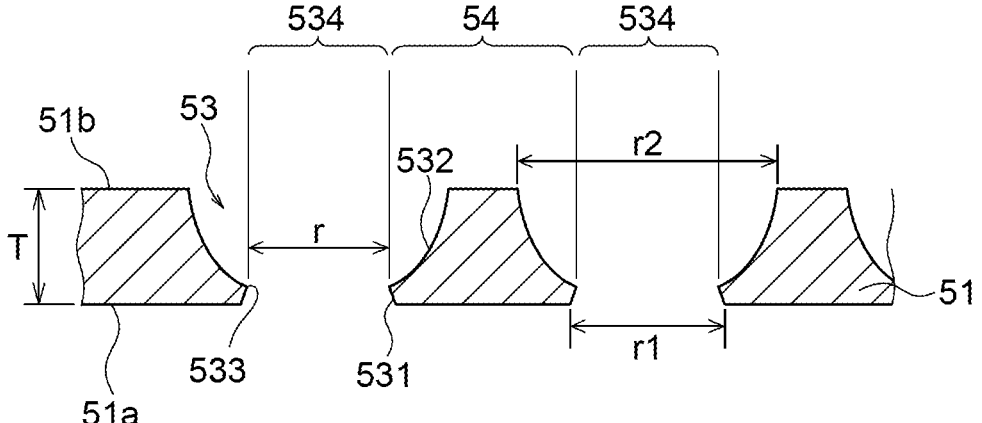
FIG. 14 is a cross-sectional view illustrating an example of a cross-sectional structure of the mask illustrated in FIG. 10.

The mask 50 will be described with reference to FIG. 9-FIG. 14. FIG. 10 is a plan view illustrating an example of the mask 50 in an enlarged manner. FIG. 11 is a plan view illustrating a first mask device 40A including the first mask 50A. FIG. 12 is a plan view illustrating a second mask device 40B including the second mask 50B, and FIG. 13 is a plan view illustrating a third mask device 40C including the third mask 50C. FIG. 14 is a cross-sectional view illustrating an example of a cross-sectional structure of the mask 50.

As illustrated in FIG. 9 and FIG. 10, the mask 50 includes at least one cell 52. The cell 52 includes the through holes 53 and the shielding regions 54 situated around the through holes 53. The cell 52 is made up of the plurality of through holes 53. The mask 50 may include two or more cells 52. In a case of fabricating a display device such as an organic EL display device or the like using the mask 50, one cell 52 may correspond to a display region of one organic EL display device, i.e., to one screen. One cell 52 may correspond to a plurality of the display regions. The shielding regions 54 may be situated between two cells 52. Although not illustrated, the mask 50 may include a through hole situated between two cells 52.

The cell 52 may have, for example, an outline that is substantially square in plan view, and more accurately, substantially rectangular in plan view. The cells 52 may have outlines of various shapes, in accordance with shapes of the display regions of organic EL display devices. For example, the cells 52 may have circular outlines.

The mask 50 has a mask third direction D3 and a mask fourth direction D4. The mask fourth direction D4 may intersect the mask third direction D3, and may be orthogonal to the mask third direction D3. The mask third direction D3 may form a 45° angle as to the element first direction G1 and the element second direction G2. The mask fourth direction D4 may form a 45° angle as to the element first direction G1 and the element second direction G2. The mask third direction D3 and the mask fourth direction D4 may be directions following an outer contour 50a of the mask 50. The mask third direction D3 may be a direction in which masks 50 are arrayed in the mask device 40 illustrated in FIG. 9, or may be a width direction of the mask 50. The mask fourth direction D4 may be a longitudinal direction of the mask 50.

As illustrated in FIG. 10, the mask 50 includes the through holes 53 and the shielding regions 54 described above. The through holes 53 are arrayed in a mask first direction D1 and a mask second direction D2. The mask first direction D1 follows the element first direction G1, and the mask second direction D2 follows the element second direction G2. The mask first direction D1 and the mask second direction D2 may form a 45° angle as to the outer contour 50a of the mask 50, and may form a 45° angle to the mask third direction D3 and the mask fourth direction D4.

Description will be made below regarding the mask 50 for forming the first electrodes 120 of the organic device 100 described above by vapor deposition.

As illustrated in FIG. 10, the mask 50 includes mask first regions M1 and mask second regions M2 as the mask 50 is viewed along a normal direction of the first face 51a. The mask first regions M1 correspond to the first display region 101 of the organic device 100. The mask second regions M2 correspond to the second display region 102 of the organic device 100. The mask second regions M2 are situated at different positions from the mask first regions M1 in plan view.

The plurality of through holes 53 may be situated in the mask first region M1. The plurality of through holes 53 in the mask first region M1 may be situated in a pattern. For example, the plurality of through holes 53 may be situated to correspond to one of the first color electrodes 120A, the second color electrodes 120B, and the third color electrodes 120C, of the first electrodes 120 in the first display region 101.

The plurality of through holes 53 may be situated in the mask second region M2. The plurality of through holes 53 in the mask second region M2 may be situated in a pattern. For example, the plurality of through holes 53 may be situated to correspond to one of the first color electrodes 120A, the second color electrodes 1206, and the third color electrodes 120C, of the first electrodes 120 in the second display region 102.

The mask 50 may have alignment marks 50M. The alignment marks 50M may be formed at corners of the cells 52 of the mask 50, for example. The alignment marks 50M may be used for positioning the mask 50 as to the substrate 110 in the process of forming the first electrodes 120 on the substrate 110 by vapor deposition using the mask 50. The alignment marks 50M may be, for example, formed at positions over the frame opening 42, or formed at positions over the frame 41. The alignment marks 50M may be used for positioning the mask 50 and the frame 41 when fabricating the mask device 40.

In a first electrode forming process which will be described later, for forming the first electrodes 120, a plurality of the masks 50 may be used. As illustrated in FIG. 11-FIG. 13, for example, the plurality of masks 50 may include the first mask 50A, the second mask 50B, and the third mask 50C. The first mask 50A, the second mask 50B, and the third mask 50C may make up different mask devices 40. The mask device 40 that includes the first mask 50A, as illustrated in FIG. 11, will also be referred to as the first mask device 40A. The mask device 40 that includes the second mask 50B, as illustrated in FIG. 12, will also be referred to as the second mask device 40B. The mask device 40 that includes the third mask 50C, as illustrated in FIG. 13, will also be referred to as the third mask device 40C.

In the first electrode forming process, for example, the first mask device 40A illustrated in FIG. 11 is attached to the vapor deposition device 10, and the first color electrodes 120A of the first electrodes 120 are formed on the substrate 110. Subsequently, the second mask device 40B illustrated in FIG. 12 is attached to the vapor deposition device 10, and the second color electrodes 120B of the first electrodes 120 are formed on the substrate 110. Subsequently, the third mask device 40C illustrated in FIG. 13 is attached to the vapor deposition device 10, and the third color electrodes 120C of the first electrodes 120 are formed on the substrate 110. In this way, in the first electrode forming process, the plurality of masks 50, such as the first mask 50A, the second mask 50B, the third mask 50C, and so forth, are used in order. The plurality of masks 50 used for forming the first electrodes 120 of the organic device 100 will also be referred to as "mask group".

As illustrated in FIG. 14, the mask 50 is made up of a metal plate 51 in which the plurality of through holes 53 are formed. The through holes 53 pass through the metal plate 51 from the first face 51a to the second face 51b.

The through holes 53 may include a first recessed portion 531 and a second recessed portion 532. The first recessed portion 531 is situated on the first face 51a. The first recessed portion 531 is formed in a recessed form on the first face 51a. The second recessed portion 532 is situated on the second face 51b. The second recessed portion 532 is formed in a recessed form on the second face 51b. The first recessed portion 531 is connected to the second recessed portion 532 in the thickness direction of the metal plate 51.

In plan view, a dimension r2 of the second recessed portion 532 may be larger than a dimension r1 of the first recessed portion 531. The first recessed portion 531 may be formed by processing the metal plate 51 by etching or the like from the first face 51a. The second recessed portion 532 may be formed by processing the metal plate 51 by etching or the like from the second face 51b. The first recessed portion 531 and the second recessed portion 532 are connected at a connecting portion 533. A heigh h of the connecting portion 533 from the first face 51a will also be referred to as cross-section height. The cross-section height can be an influencing factor on shadows, which will be described later.

Symbol 534 denotes a penetrating portion. An opening area of the through hole 53 in plan view is the smallest at the penetrating portion 534. The penetrating portion 534 may be defined by the connecting portion 533. In FIG. 14, the penetrating portion 534 is indicated by dimension r. Dimension r is smaller than dimension r1, and is smaller than dimension r2.

In vapor deposition using the mask 50, the vapor deposition material 7 passes through the penetrating portions 534 of the through holes 53, from the second face 51b to the first face 51a. Due to the vapor deposition material 7 that has passed through adhering to the substrate 110, the first electrodes 120 described above are formed on the substrate 110. More specifically, layers, such as the first color electrodes 120A, the second color electrodes 120B, and the third color electrodes 120C described above, are formed on the substrate 110. Planar outlines of the color electrodes 120A-120C formed on the substrate 110 are primarily defined by planar outlines of the penetrating portions 534.

The through holes 53 may have, in plan view, substantially circular outlines or substantially elliptic outlines, or may have substantially polygonal outlines. For example, the through holes 53 may have substantially square outlines, substantially hexagonal outlines, or substantially octagonal outlines. The through holes 53 may be formed having similar shapes in the thickness direction of the mask 50. In example illustrated in FIG. 15-FIG. 17, the through holes 53 have substantially circular outlines, in the same way as the first color electrodes 120A, the second color electrodes 120B, and the third color electrodes 120C, described above. A diameter of a second through hole 53B, which will be described later, may be larger than a diameter of a first through hole 53A. A diameter of a third through hole 53C may be smaller than the diameter of the first through hole 53A.

Regions of the metal plate 51 other than the penetrating portions 534 are the shielding regions 54 described above. The shielding regions 54 can shield the vapor deposition material 7 heading toward the substrate 110.

The shielding regions 54 in the mask second region M2 may include recessed portions that do not penetrate the metal plate 51. Providing the recessed portions in the mask second region M2 enables rigidity of the mask second region M2 to be reduced. Thus, difference between rigidity of the mask second region M2 and rigidity of the mask first region M1 can be reduced. Accordingly, occurrence of wrinkles in the mask 50 due to the difference in rigidities can be suppressed. Wrinkles occur readily when tension is applied to the mask 50, for example.

A thickness T of the mask 50 may be, for example, 5 μm or more, may be 10 μm or more, may be 15 μm or more, or may be 20 μm or more. The thickness T of the mask 50 may be, for example, 25 μm or less, may be 30 μm or less, may be 50 μm or less, or may be 100 μm or less. A range of the thickness T of the mask 50 may be set by a first group made up of 5 μm, 10 μm, 15 μm, and 20 μm, and/or a second group made up of 25 μm, 30 μm, 50 μm, and 100 μm. The range of the thickness T of the mask 50 may be determined by a combination of any one of values included in the first group described above, and any one of values included in the second group described above. The range of the thickness T of the mask 50 may be determined by a combination of any two of values included in the first group described above. The range of the thickness T of the mask 50 may be determined by a combination of any two of values included in the second group described above. For example, the range of the thickness T of the mask 50 may be 5 μm or more and 100 μm or less, 5 μm or more and 50 μm or less, may be 5 μm or more and 30 μm or less, may be 5 μm or more and 25 μm or less, may be 5 μm or more and 20 μm or less, may be 5 μm or more and 15 μm or less, may be 5 μm or more and 10 μm or less, may be 10 μm or more and 100 μm or less, may be 10 μm or more and 50 μm or less, may be 10 μm or more and 30 μm or less, may be 10 μm or more and 25 μm or less, may be 10 μm or more and 20 μm or less, may be 10 μm or more and 15 μm or less, may be 15 μm or more and 100 μm or less, may be 15 μm or more and 50 μm or less, may be 15 μm or more and 30 μm or less, may be 15 μm or more and 25 μm or less, may be 15 μm or more and 20 μm or less, may be 20 μm or more and 100 μm or less, may be 20 μm or more and 50 μm or less, may be 20 μm or more and 30 μm or less, may be 20 μm or more and 25 μm or less, may be 25 μm or more and 100 μm or less, may be 25 μm or more and 50 μm or less, may be 25 μm or more and 30 μm or less, may be 30 μm or more and 100 μm or less, may be 30 μm or more and 50 μm or less, or may be 50 μm or more and 100 μm or less.

As for a method of measuring the thickness T of the mask 50, a contact-type measurement method is employed. For the contact-type measurement method, an "MT1271" from HEIDENHAIN-METRO, which is a length gauge including a ball-bush guided plunger, manufactured by HEIDEN-HAIN, is used.

The cross-sectional shape of the through holes 53 is not limited to the shape illustrated in FIG. 14. The method of forming the through holes 53 is not limited to etching, and various types of methods can be employed. For example, the mask 50 may be formed by performing plating such that the through holes 53 are formed.

An iron alloy containing nickel, for example, may be used as the material making up the mask 50. The iron alloy may further contain cobalt in addition to nickel. For example, as the material of the mask 50, an iron alloy of which the total content of nickel and cobalt is 30% by mass or more and 54% by mass or less, and in which the content of cobalt is 0% by mass or more and 6% by mass or less, may be used. As for the iron alloy containing nickel, or containing nickel and cobalt, Invar with a nickel content of 34% by mass or more and 38% by mass or less, Super Invar with a nickel content of 30% by mass or more and 34% by mass or less and also containing cobalt in addition to nickel, low thermal expansion Fe—Ni plated alloy with a nickel content of 38% by mass or more and 54% by mass or less, and so forth, may be used. Using such an iron alloy enables the coefficient of thermal expansion of the mask 50 to be kept low. For example, in a case in which a glass substrate is used as the substrate 110, the coefficient of thermal expansion of the mask 50 can be kept at a low value that is equivalent to that of the glass substrate. Thus, deterioration in dimensional precision and positional precision of vapor deposition layers formed on the substrate 110 during the vapor deposition process due to difference in the coefficient of thermal expansion between the mask 50 and the substrate 110 can be suppressed.

A mask group 56 will be described. The mask group 56 includes two or more masks 50. In the present embodiment, the first mask 50A, the second mask 50B, and the third mask 50C, which are described above, may be included in the mask group 56. A stack obtained by stacking the first mask 50A, the second mask 50B, and the third mask 50C, will also be referred to as a mask stack 55.

Figure 15:
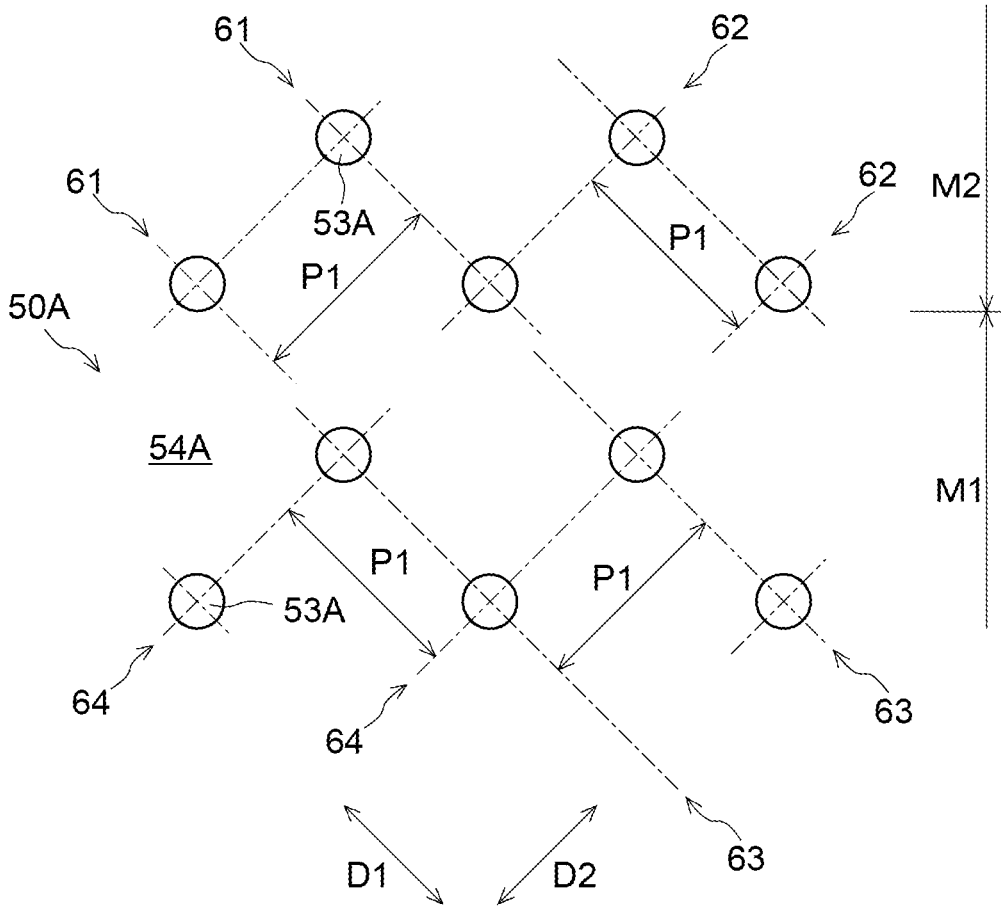
FIG. 15 is an enlarged plan view illustrating an example of a first mask including first through holes, for forming the first electrodes illustrated in FIG. 7.

The first mask 50A will be described in further detail with reference to FIG. 15. FIG. 15 is a plan view illustrating the mask first region M1 and the mask second region M2 on the first face 51a of the first mask 50A, in an enlarged manner.

As illustrated in FIG. 15, the first mask 50A includes first through holes 53A and first shielding regions 54A. The first through holes 53A are situated at positions corresponding to the first color electrodes 120A of the first electrodes 120 in each of the mask first region M1 and the mask second region M2.

Outlines of the through holes 53 illustrated in FIG. 15, and in FIG. 16-FIG. 20 that will be described later, are outlines of the through holes 53A-53C on first faces 51a of the masks 50A-50C. The outlines of the through holes 53A-53C on the first faces 51a are equivalent to the outlines of the first recessed portions 531 on the first faces 51a.

As illustrated in FIG. 15, the first through holes 53A in each of the mask first region M1 and the mask second region M2 may be arrayed following the mask first direction D1, and may be arrayed following the mask second direction D2.

The first through holes 53A situated in the mask second region M2 may be arrayed following a first hole array 61, which will be described later, following the mask first direction D1. The first through holes 53A situated in the mask second region M2 may be arrayed following a second hole array 62, which will be described later, following the mask second direction D2. The first through holes 53A situated in the mask first region M1 may be arrayed following a third hole array 63, which will be described later, following the mask first direction D1. The first through holes 53A situated in the mask first region M1 may be arrayed following a fourth hole array 64, which will be described later, following the mask second direction D2.

The pitch of the first through holes 53A following the mask first direction D1 may be the first pitch P1, in the same way as with the first color electrodes 120A described above. The pitch of the first through holes 53A following the mask second direction D2 may be the first pitch P1. The first through holes 53A situated in the mask first region M1 may be arrayed equidistantly following each of the mask first direction D1 and the mask second direction D2. The first through holes 53A situated in the mask second region M2 may be arrayed equidistantly following each of the mask first direction D1 and the mask second direction D2.

Figure 16:
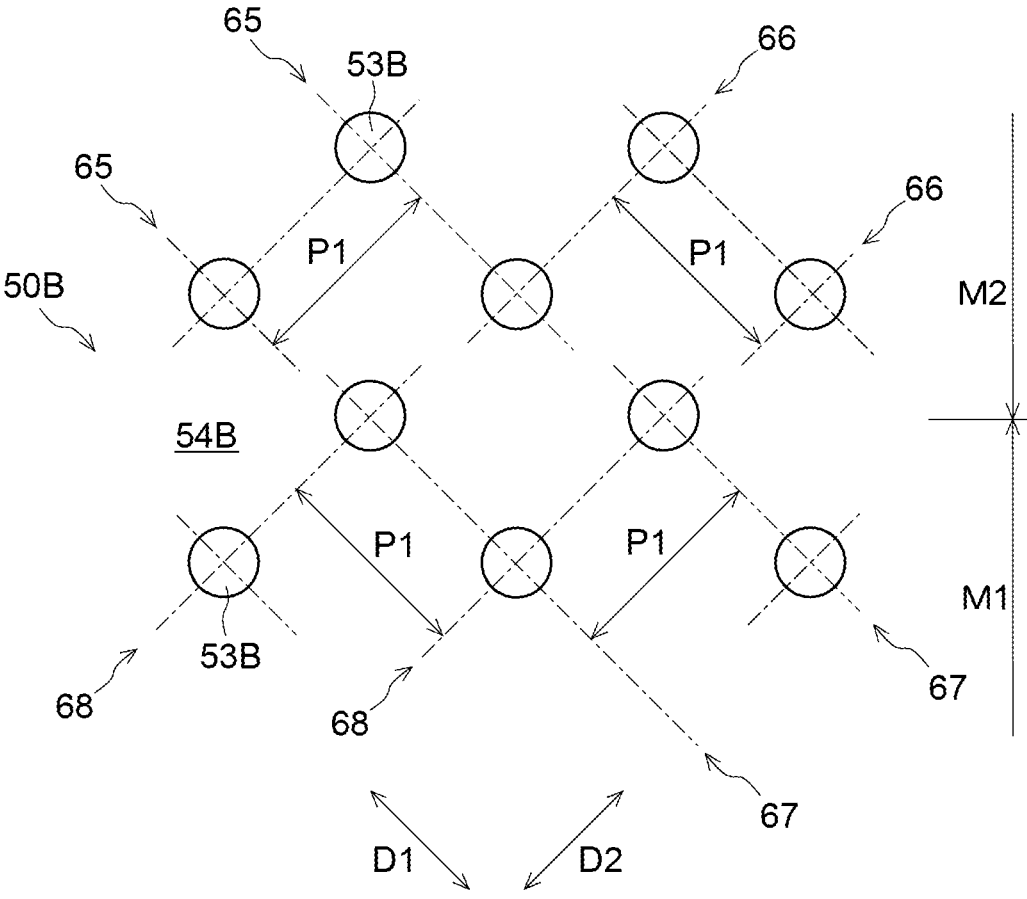
FIG. 16 is an enlarged plan view illustrating an example of a second mask including second through holes, for forming the first electrodes illustrated in FIG. 7.

The second mask 50B will be described in further detail with reference to FIG. 16. FIG. 16 is a plan view illustrating the mask first region M1 and the mask second region M2 on the first face 51a of the second mask 50B, in an enlarged manner.

As illustrated in FIG. 16, the second mask 50B includes second through holes 53B and second shielding regions 54B. The second through holes 53B are situated at positions corresponding to the second color electrodes 120B of the first electrodes 120 in each of the mask first region M1 and the mask second region M2.

As illustrated in FIG. 16, the second through holes 53B in each of the mask first region M1 and the mask second region M2 may be arrayed following the mask first direction D1, and may be arrayed following the mask second direction D2.

The second through holes 53B situated in the mask second region M2 may be arrayed following a fifth hole array 65, which will be described later, following the mask first direction D1. The second through holes 53B situated in the mask second region M2 may be arrayed following a sixth hole array 66, which will be described later, following the mask second direction D2. The second through holes 53B situated in the mask first region M1 may be arrayed following a seventh hole array 67, which will be described later, following the mask first direction D1. The second through holes 53B situated in the mask first region M1 may be arrayed following an eighth hole array 68, which will be described later, following the mask second direction D2.

The pitch of the second through holes 53B following the mask first direction D1 may be the first pitch P1, in the same way as with the second color electrodes 120B described above, and may be equal to the pitch of the first through holes 53A. The pitch of the second through holes 53B following the mask second direction D2 may be the first pitch P1, and may be equal to the pitch of the first through holes 53A. The second through holes 53B situated in the mask first region M1 may be arrayed equidistantly following each of the mask first direction D1 and the mask second direction D2. The second through holes 53B situated in the mask second region M2 may be arrayed equidistantly following each of the mask first direction D1 and the mask second direction D2.

Figure 17:
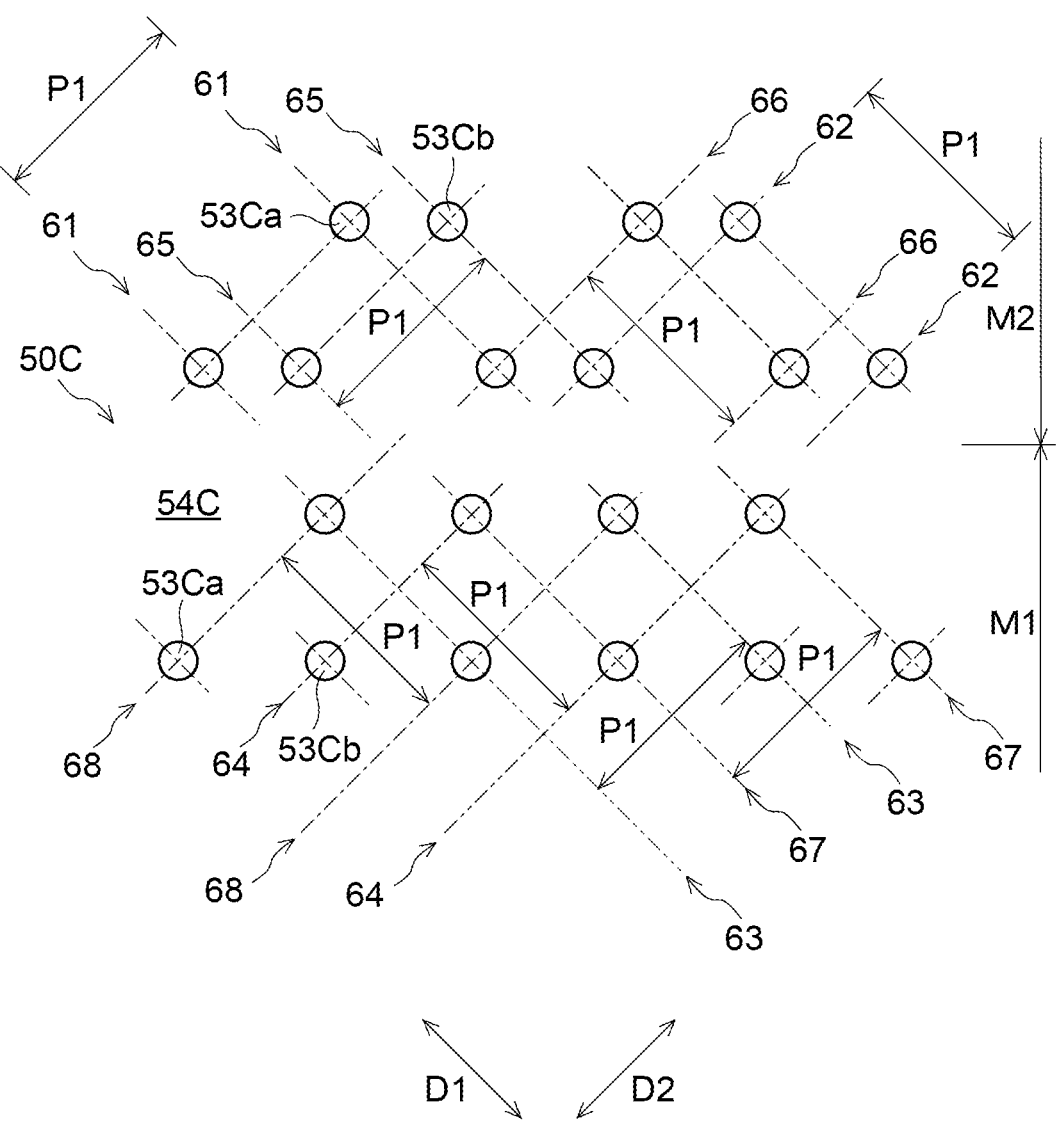
FIG. 17 is an enlarged plan view illustrating an example of a third mask including third through holes, for forming the first electrodes illustrated in FIG. 7.

The third mask 50C will be described in further detail with reference to FIG. 17. FIG. 17 is a plan view illustrating the mask first region M1 and the mask second region M2 on the first face 51*a* of the third mask 50C, in an enlarged manner.

As illustrated in FIG. 17, the third mask 50C includes third through holes 53C and the third shielding regions 54C. The third through holes 53C are situated at positions corresponding to the third color electrodes 120C of the first electrodes 120 in each of the mask first region M1 and the mask second region M2.

Two third through holes 53C that make up one through hole group 53G, which will be described later, may include one third through hole 53Ca, and one third through hole 53Cb. The third through holes 53Ca are situated at positions corresponding to the third color electrodes 120Ca of the first electrodes 120, and the third through holes 53Cb are situated at positions corresponding to the third color electrodes 120Cb of the first electrodes 120. In the description of the present specification, in a case of describing configurations of the third through holes 53C that are common to the third through holes 53Ca and the third through holes 53Cb, the term and symbol "third through hole 53C" will be used.

As illustrated in FIG. 17, the third through holes 53C in each of the mask first region M1 and the mask second region M2 may be arrayed following the mask first direction D1, and may be arrayed following the mask second direction D2.

The third through holes 53Ca situated in the mask second region M2 may be arrayed following the first hole array 61, which will be described later, following the mask first direction D1. The third through holes 53Cb situated in the mask second region M2 may be arrayed following the second hole array 62, which will be described later, following the mask second direction D2. The third through holes 53Cb situated in the mask second region M2 may be arrayed following the fifth hole array 65, which will be described later, following the mask first direction D1. The third through holes 53Ca situated in the mask second region M2 may be arrayed following the sixth hole array 66, which will be described later, following the mask second direction D2.

The third through holes 53Ca situated in the mask first region M1 may be arrayed following the third hole array 63, which will be described later, following the mask first direction D1. The third through holes 53Cb situated in the mask first region M1 may be arrayed following the fourth hole array 64, which will be described later, following the mask second direction D2. The third through holes 53Cb situated in the mask first region M1 may be arrayed following the seventh hole array 67, which will be described later, following the mask first direction D1. The third through holes 53Ca situated in the mask first region M1 may be arrayed following the eighth hole array 68, which will be described later, following the mask second direction D2.

The pitch of the third through holes 53Ca following the mask first direction D1 may be the first pitch P1, in the same way as with the third color electrodes 120Ca described above, and may be equal to the pitch of the first through holes 53A. The pitch of the third through holes 53Cb following the mask first direction D1 may be the first pitch P1, and may be equal to the pitch of the first through holes 53A. The pitch of the third through holes 53Ca following the mask second direction D2 may be the first pitch P1, and may be equal to the pitch of the first through holes 53A. The pitch of the third through holes 53Cb following the mask second direction D2 may be the first pitch P1, and may be equal to the pitch of the first through holes 53A.

The third through holes 53Ca situated in the mask first region M1 may be arrayed equidistantly following each of the mask first direction D1 and the mask second direction D2. The third through holes 53Cb situated in the mask first region M1 may be arrayed equidistantly following each of the mask first direction D1 and the mask second direction D2. The third through holes 53Ca situated in the mask second region M2 may be arrayed equidistantly following each of the mask first direction D1 and the mask second direction D2. The third through holes 53Cb situated in the mask second region M2 may be arrayed equidistantly following each of the mask first direction D1 and the mask second direction D2.

A method of measuring the shapes and positions of the through holes 53A-53C of the masks 50A-50C will be described. The shapes and positions of the through holes 53A-53C on the first faces 51*a* of the masks 50A-50C are measured by performing image processing of the first faces 51*a*. Imaging of the first faces 51*a* of the masks 50A-50C is performed using a photography device, thereby acquiring image data relating to the outlines of the through holes 53A-53C on the first faces 51*a*. On the basis of the acquired image data, the shapes and positions of the through holes 53A-53C are calculated, and also the above pitches of the through holes 53A-53C are calculated.

Figure 18:
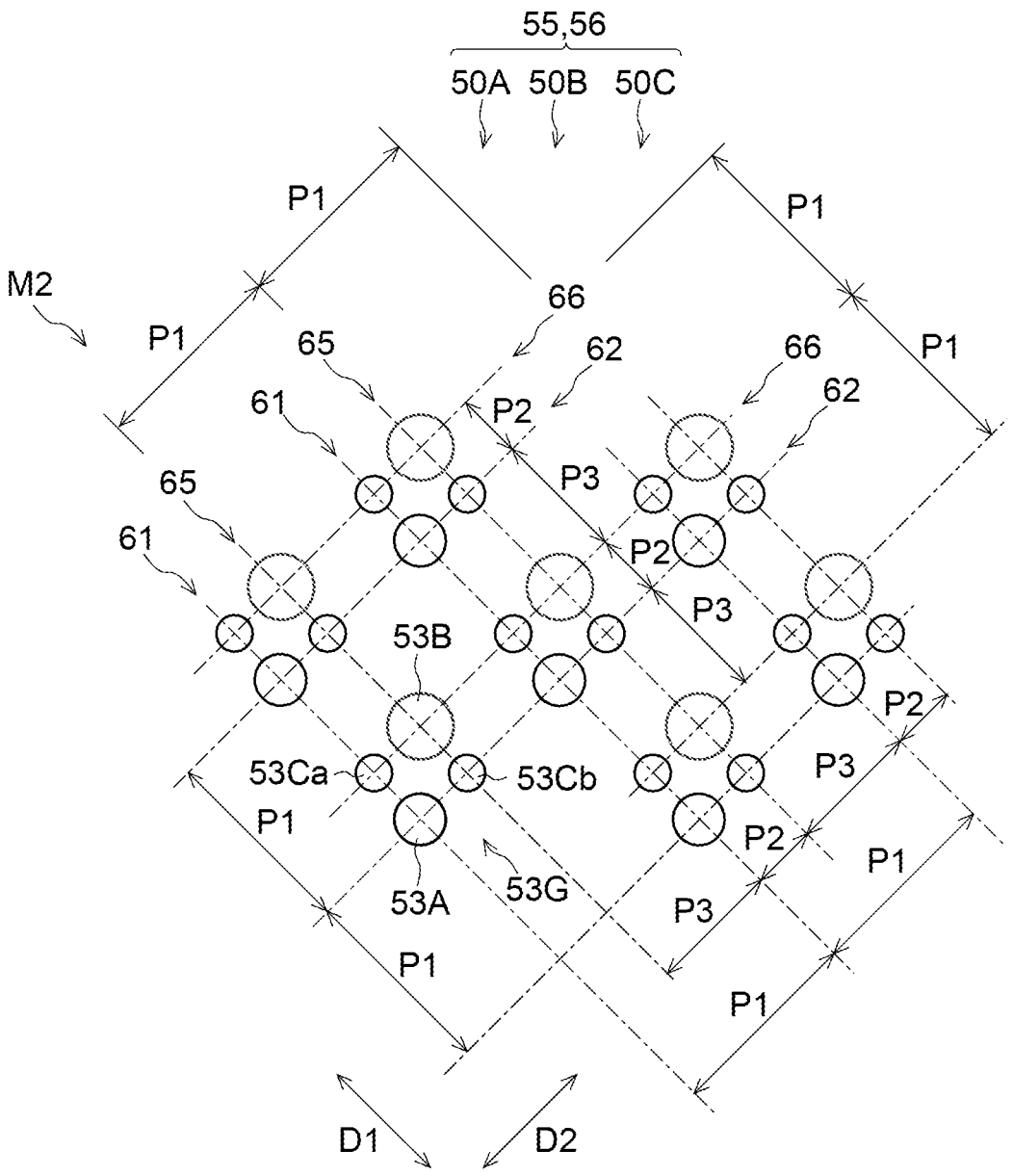
FIG. 18 is an enlarged plan view illustrating through holes of a mask group in a mask second region.
Figure 19:
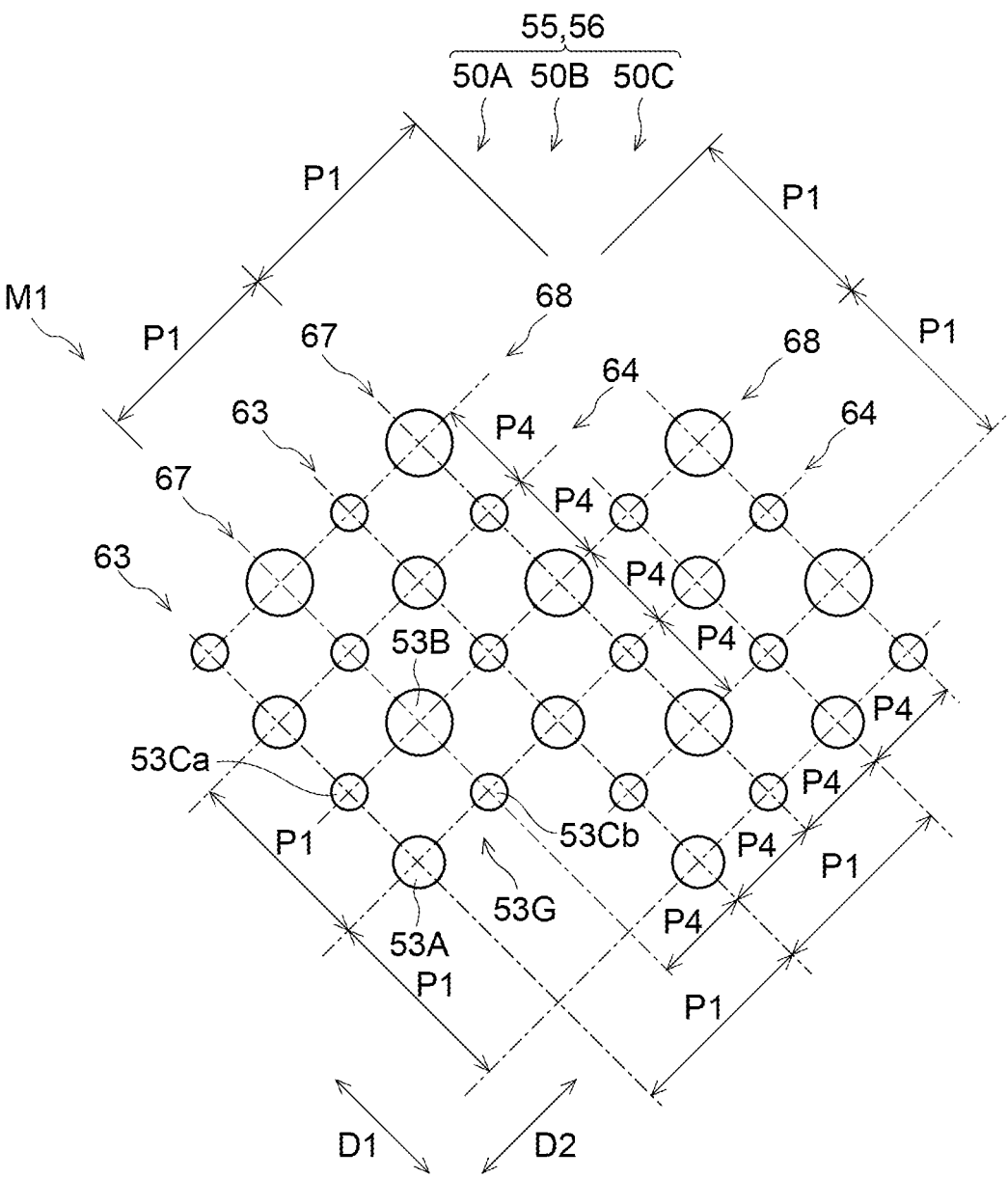
FIG. 19 is an enlarged plan view illustrating through holes of a mask group in a mask first region.
Figure 20:
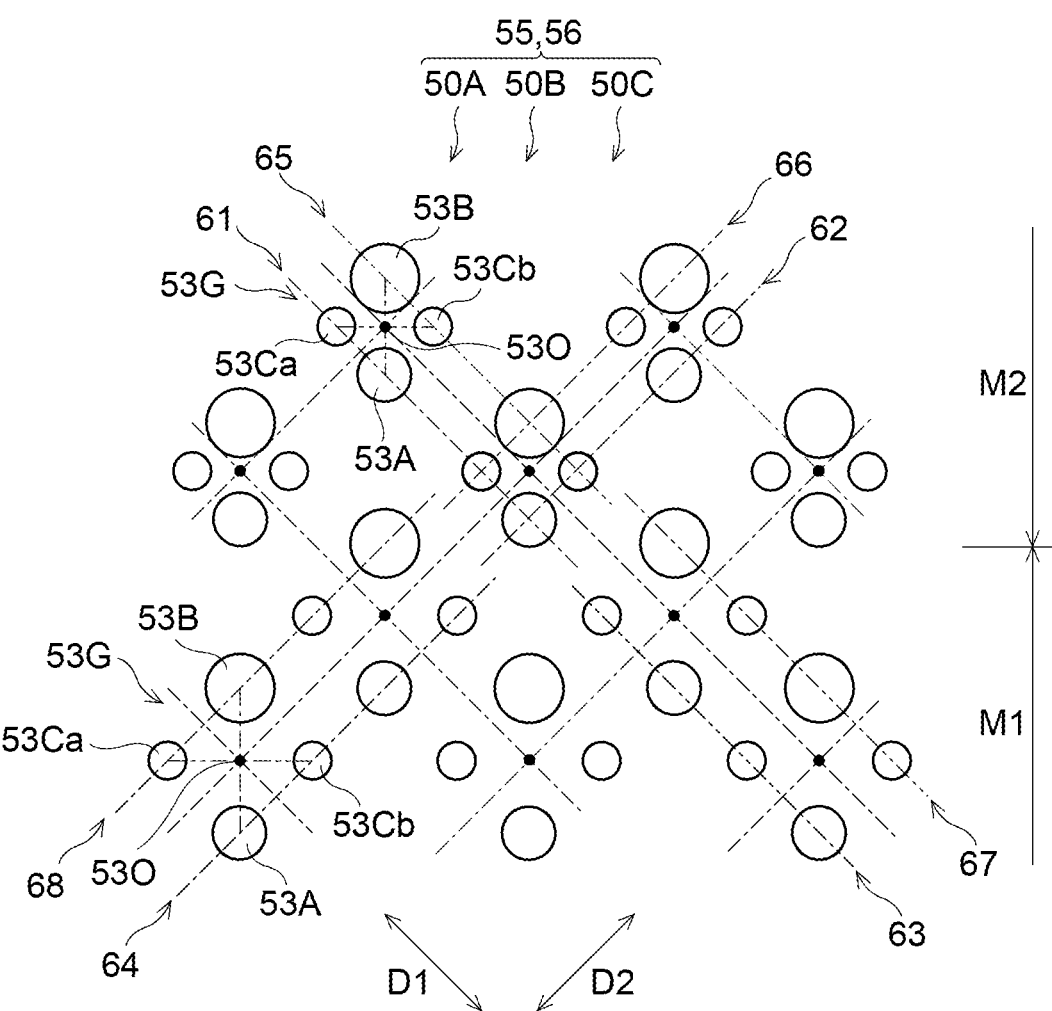
FIG. 20 is an enlarged plan view illustrating through holes of a mask group in the mask first region and the mask second region.

Positional relations of the first mask 50A, the second mask 50B, and the third mask 50C will be described with reference to FIG. 18-FIG. 20. FIG. 18 is an enlarged plan view illustrating the through holes 53 of the mask group 56 in the mask second region M2. FIG. 19 is an enlarged plan view illustrating through holes 53 of the mask group 56 in the mask first region M1. FIG. 20 is an enlarged plan view illustrating the through holes 53 of the mask group 56 in the mask first region M1 and the mask second region M2.

The mask group 56 may be the mask stack 55, and the mask stack 55 includes two or more masks 50 that are stacked. The mask stack 55 illustrated in FIG. 18-FIG. 20 includes the first mask 50A, the second mask 50B, and the third mask 50C, that are stacked. A set of through holes 53 corresponding to one element 115 will be referred to as through hole group 53G in the following description. One through hole group 53G includes one first through hole 53A, one second through hole 53B, and two third through holes 53C.

In the mask stack 55, the alignment marks 50M (see FIG. 11-FIG. 13) of the masks 50A-50C may be aligned on each other. Alternatively, the masks 50A-50C may be stacked on the basis of positions of the cells 52 of the masks 50A-50C. Alternatively, the masks 50A-50C may be stacked on the basis of positions of the through holes 53A-53C and the shielding regions 54A-54C of the masks 50A-50C. When stacking the masks 50A-50C, tension may be applied to the masks 50A-50C.

A diagram illustrating a state in which two or more masks 50 are stacked may be obtained by overlaying image data of the masks 50. For example, image data of the first faces 51*a* of the masks 50A-50C acquired as described above is overlaid, using an image processing device. Accordingly, diagrams such as in FIG. 18-FIG. 20 can be created. When acquiring the image data, tension may be applied to the masks 50A-50C. A diagram of a state in which two or more masks 50 are stacked may be acquired by overlaying engineering drawings for manufacturing the masks 50A-50C.

As illustrated in FIG. 18 and FIG. 19, in each of the mask first region M1 and the mask second region M2, the first through holes 53A and the third through holes 53C may be arrayed in an alternating manner following the mask first direction D1, and may be arrayed in an alternating manner following the mask second direction D2.

As illustrated in FIG. 18, the first through holes 53A and the third through holes 53Ca situated in the mask second region M2 may make up the first hole array 61 following the mask first direction D1. The first hole array 61 corresponds to the first electrode array 151 described above. A plurality of the first hole arrays 61 may be formed in the mask second region M2. The first through holes 53A and the third through holes 53Cb situated in the mask second region M2 may make up the second hole array 62 following the mask second direction D2. The second hole array 62 corresponds to the second electrode array 152 described above. A plurality of the second hole arrays 62 may be formed in the mask second region M2.

The first through holes 53A and the third through holes 53C situated in the mask second region M2 may be arrayed so as to alternate between the second pitch P2 and the third pitch P3, following each of the mask first direction D1 and the mask second direction D2. The pitch of the first through hole 53A and the third through hole 53Ca making up one through hole group 53G in the first hole array 61 described above may be the second pitch P2 described above. Of two through hole groups 53G that are adjacent in the first hole array 61, the pitch of a first through hole 53A making up one of the through hole groups 53G and a third through hole 53Ca making up the other of the through hole groups 53G may be the third pitch P3 described above. The pitch of the first through hole 53A and the third through hole 53Cb making up one through hole group 53G in the second hole array 62 described above may be the second pitch P2. Of two through hole groups 53G that are adjacent in the second hole array 62, the pitch of a first through hole 53A making up one of the through hole groups 53G and a third through hole 53Cb making up the other of the through hole groups 53G may be the third pitch P3.

As illustrated in FIG. 19, the first through holes 53A and the third through holes 53Ca situated in the mask first region M1 may make up the third hole array 63 following the mask first direction D1. The third hole array 63 corresponds to the third electrode array 153 described above. A plurality of the third hole arrays 63 may be formed in the mask first region M1. The first through holes 53A and the third through holes 53Cb situated in the mask first region M1 may make up the fourth hole array 64 following the mask second direction D2. The fourth hole array 64 corresponds to the fourth electrode array 154 described above. A plurality of the fourth hole arrays 64 may be formed in the mask first region M1.

The first through holes 53A and the third through holes 53C situated in the mask first region M1 may be arrayed at the fourth pitch P4, following each of the mask first direction D1 and the mask second direction D2. In the third hole array 63 described above, the pitch of the first through holes 53A and the third through holes 53Ca may be the fourth pitch P4. In the fourth hole array 64 described above, the pitch of the first through holes 53A and the third through holes 53Cb may be the fourth pitch P4. The first through holes 53A and the third through holes 53C situated in the mask first region M1 may be arrayed equidistantly following each of the mask first direction D1 and the mask second direction D2.

As illustrated in FIG. 18 and FIG. 19, in each of the mask first region M1 and the mask second region M2, the second through holes 53B and the third through holes 53C may be arrayed in an alternating manner following the mask first direction D1, and may be arrayed in an alternating manner following the mask second direction D2.

As illustrated in FIG. 18, the second through holes 53B and the third through holes 53Cb situated in the mask second region M2 may make up the fifth hole array 65 following the mask first direction D1. The fifth hole array 65 corresponds to the fifth electrode array 155 described above. A plurality of the fifth hole arrays 65 may be formed in the mask second region M2. The second through hole 53B and the third through holes 53Ca situated in the mask second region M2 may make up the sixth hole array 66 following the mask second direction D2. The sixth hole array 66 corresponds to the sixth electrode array 156 described above. A plurality of the sixth hole arrays 66 may be formed in the mask second region M2.

The second through hole 53B and the third through holes 53C situated in the mask second region M2 may be arrayed so as to alternate between the second pitch P2 and the third pitch P3, following each of the mask first direction D1 and the mask second direction D2. The pitch of the second through hole 53B and the third through hole 53Cb making up one through hole group 53G in the fifth hole array 65 described above may be the second pitch P2 described above. Of two through hole groups 53G that are adjacent in the fifth hole array 65, the pitch of a second through hole 53B making up one of the through hole groups 53G and a third through hole 53Cb making up the other of the through hole groups 53G may be the third pitch P3 described above. The pitch of the second through hole 53B and the third through hole 53Ca making up one through hole group 53G in the sixth hole array 66 described above may be the second pitch P2. Of two through hole groups 53G that are adjacent in the sixth hole array 66, the pitch of a second through hole 53B making up one of the through hole groups 53G and a third through hole 53Ca making up the other of the through hole groups 53G may be the third pitch P3.

As illustrated in FIG. 19, the second through holes 53B and the third through holes 53Cb situated in the mask first region M1 may make up the seventh hole array 67 following the mask first direction D1. The seventh hole array 67 corresponds to the seventh electrode array 157 described above. A plurality of the seventh hole arrays 67 may be formed in the mask first region M1. The second through holes 53B and the third through holes 53Ca situated in the mask first region M1 may make up the eighth hole array 68 following the mask second direction D2. The eighth hole array 68 corresponds to the eighth electrode array 158 described above. A plurality of the eighth hole arrays 68 may be formed in the mask first region M1.

The second through holes 53B and the third through holes 53C situated in the mask first region M1 may be arrayed at the fourth pitch P4, following each of the mask first direction D1 and the mask second direction D2. In the seventh hole array 67 described above, the pitch of the second through holes 53B and the third through holes 53Cb may be the fourth pitch P4. In the eighth hole array 68 described above, the pitch of the second through holes 53B and the third through holes 53Ca may be the fourth pitch P4.

As illustrated in FIG. 20, the through hole groups 53G situated in the mask first region M1 and the through hole groups 53G situated in the mask second region M2 may be arrayed following the mask first direction D1, and may be arrayed following the mask second direction D2. More specifically, centers 530 of the through hole groups 53G situated in the mask first region M1 and centers 530 of the through hole groups 53G situated in the mask second region M2 may be arrayed following the mask first direction D1, and may be arrayed following the mask second direction D2. The centers 530 of the through hole groups 53G situated in the mask second region M2 may be situated on extension lines of arrays of the centers 530 of the through hole group 53G situated in the mask first region M1, following each of the mask first direction D1 and the mask second direction D2. The centers 530 of the through hole group 53G may be intersections between line segments connecting centers of the first through holes 53A and centers of the second through holes 53B, and line segments connecting centers of the third through holes 53Ca and centers of the third through holes 53Cb. In this case, the centers 530 of the through hole groups 53G are situated at intermediate positions between the centers of the first through holes 53A and the centers of the second through holes 53B, and are also situated at intermediate positions between the centers of the third through holes 53Ca and the centers of the third through holes 53Cb.

As illustrated in FIG. 20, the first hole arrays 61 described above may be offset from the third hole arrays 63 described above, in the mask second direction D2. The second hole arrays 62 described above may be offset from the fourth hole arrays 64 described above, in the mask first direction D1. The fifth hole arrays 65 described above may be offset from the seventh hole arrays 67 described above, in the mask second direction D2. The sixth hole arrays 66 described above may be offset from the eighth hole arrays 68 described above, in the mask first direction D1.

Figure 21:
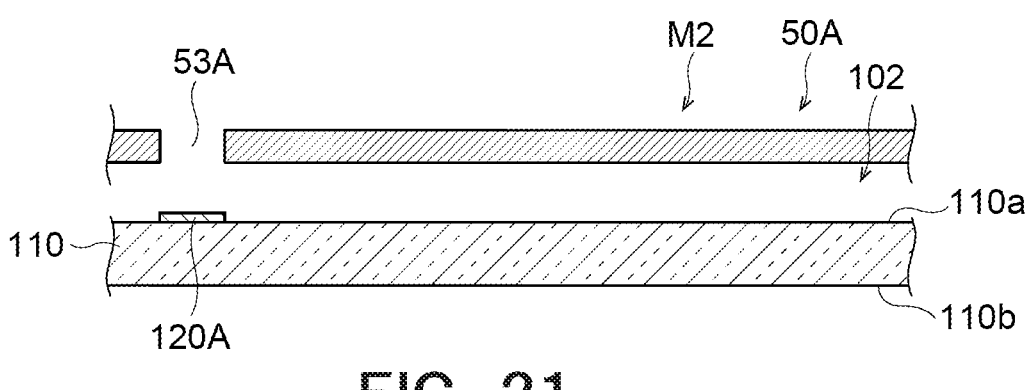
FIG. 21 is a cross-sectional view for describing, in a first electrode forming process of a manufacturing method of the organic device, a process for forming a first color electrode.
Figure 22:
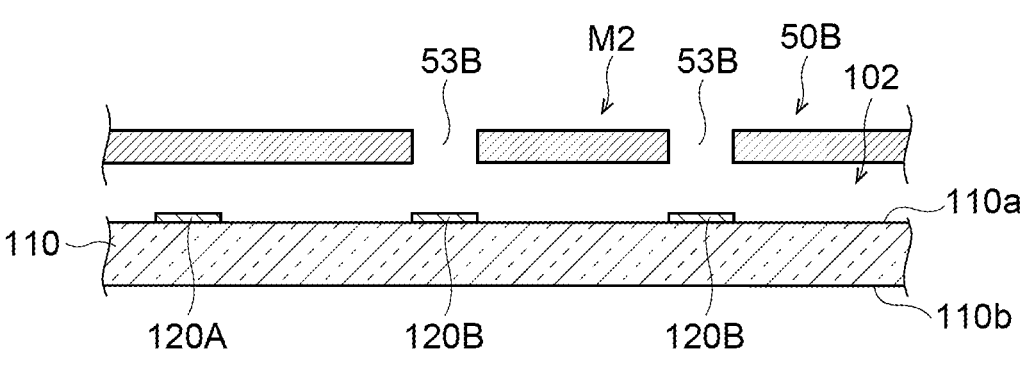
FIG. 22 is a cross-sectional view for describing, in the first electrode forming process of the manufacturing method of the organic device, a process for forming a second color electrode.
Figure 23:
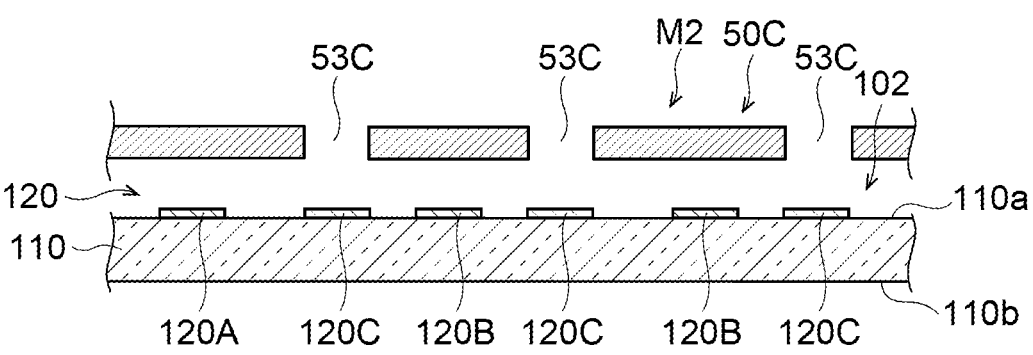
FIG. 23 is a cross-sectional view for describing, in the first electrode forming process of the manufacturing method of the organic device, a process for forming a third color electrode.
Figure 24:
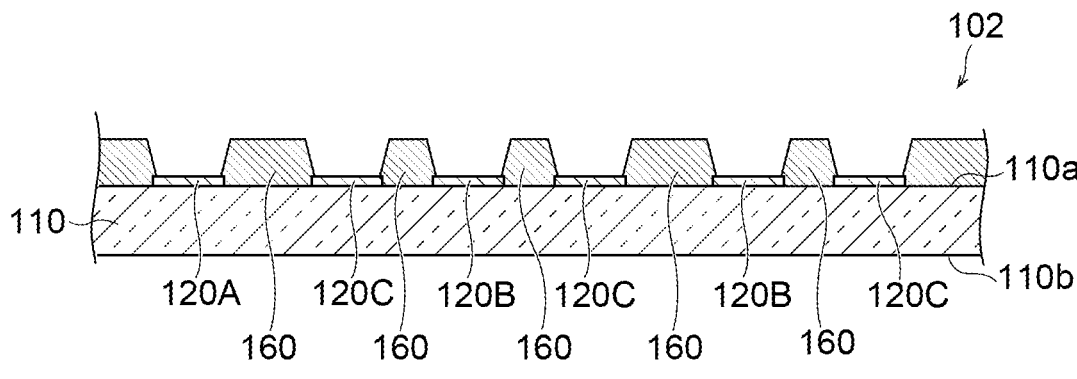
FIG. 24 is a cross-sectional view for describing an insulating layer forming process of the manufacturing method of the organic device.
Figure 25:
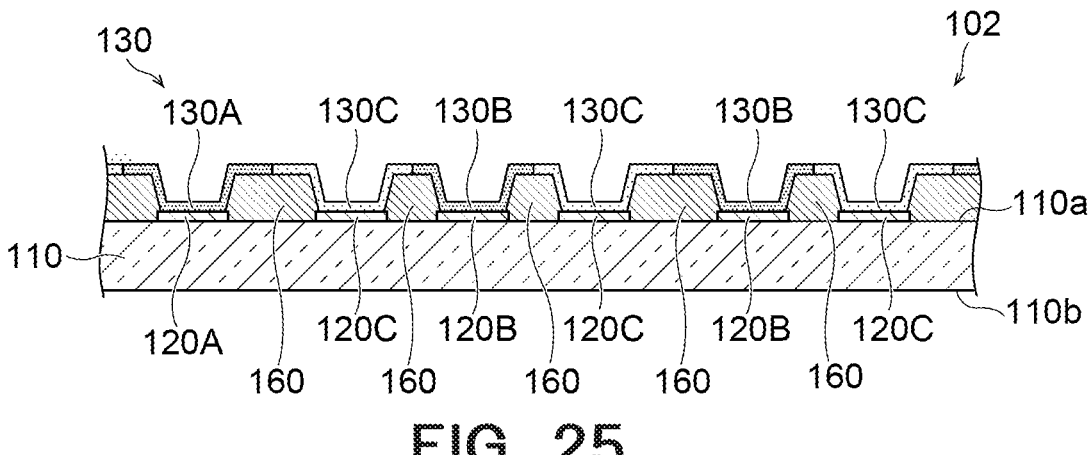
FIG. 25 is a cross-sectional view for describing an organic layer forming process of the manufacturing method of the organic device.
Figure 26:
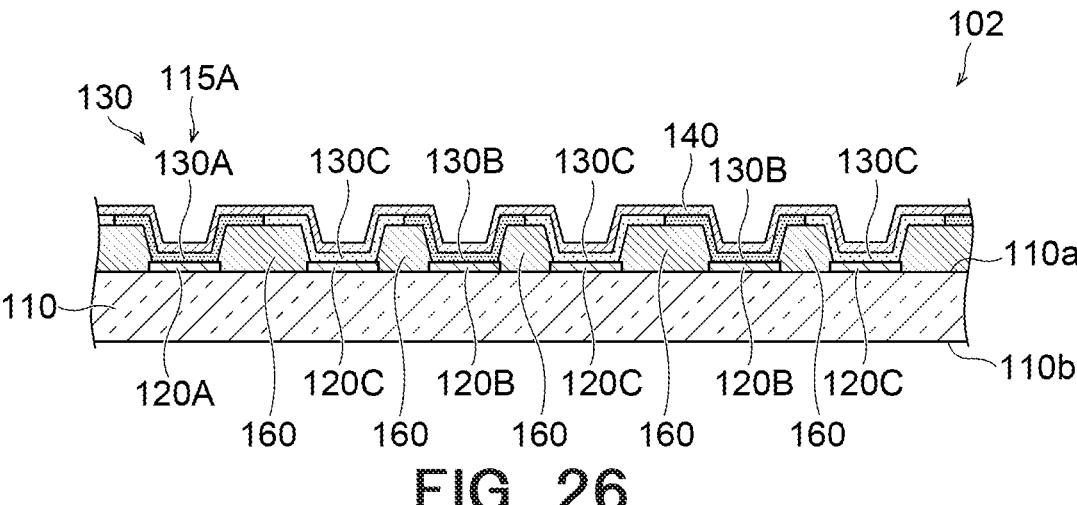
FIG. 26 is a cross-sectional view for describing a second electrode forming process of the manufacturing method of the organic device.

An example of a manufacturing method of the organic device 100 will be described with reference to FIG. 21-FIG. 26. FIG. 21 is a cross-sectional view for describing a process for forming the first color electrodes 120A of the first electrodes 120. FIG. 22 is a cross-sectional view for describing a process for forming the second color electrodes 120B of the first electrodes 120, and FIG. 23 is a cross-sectional view for describing a process for forming the third color electrodes 120C of the first electrodes 120. FIG. 24 is a cross-sectional view for describing an insulating layer forming process. FIG. 25 is a cross-sectional view for describing an organic layer forming process. FIG. 26 is a cross-sectional view for describing a second electrode forming process. Although a manufacturing method of the organic device 100 will be described below by way of cross-sectional views of the second display region 102, the organic device 100 can be manufactured in the same way in the first display region 101 as well.

First, the substrate 110 is prepared.

Subsequently, the first electrode forming process may be carried out.

In the first electrode forming process, the first electrodes 120 are formed on the substrate 110 using the mask group 56 described above.

First, as illustrated in FIG. 21, a process of forming the first color electrodes 120A of the first electrodes 120 by vapor deposition using the first mask 50A may be carried out. For example, vapor deposition of a conductive material or the like such as metal or the like on the substrate 110 may be performed through the first through holes 53A of the first mask 50A. Thus, the first color electrodes 120A are formed.

Subsequently, as illustrated in FIG. 22, a process of forming the second color electrodes 120B of the first electrodes 120 by vapor deposition using the second mask 50B may be carried out. For example, vapor deposition of a conductive material or the like such as metal or the like on the substrate 110 may be performed through the second through holes 53B of the second mask 50B. Thus, the second color electrodes 120B are formed.

Subsequently, as illustrated in FIG. 23, a process of forming the third color electrodes 120C of the second electrode 140 by vapor deposition using the third mask 50C may be carried out. For example, vapor deposition of a conductive material or the like such as metal or the like on the substrate 110 may be performed through the third through holes 53C of the third mask 50C. Thus, the third color electrodes 120C are formed.

The order of forming the first color electrodes 120A, the second color electrodes 120B, and the third color electrodes 120C is not limited in particular. For example, the processes may be carried out in the order of the third color electrodes 120C, the second color electrodes 120B, and the first color electrodes 120A.

Subsequently, as illustrated in FIG. 24, the insulating layer forming process may be carried out. The insulating layer 160 is formed among the color electrodes 120A-120C of the first electrodes 120. The insulating layer 160 may overlap on edge portions of the color electrodes 120A-120C.

Subsequently, as illustrated in FIG. 25, the organic layer forming process may be carried out. The organic layers 130 including the first color organic layers 130A, the second color organic layers 130B, and the third color organic layers 130C are formed on the first electrodes 120. The first color organic layers 130A may be formed by vapor deposition using a mask having through holes corresponding to the first color organic layers 130A, for example. The first color organic layers 130A may be formed by performing vapor deposition of organic material or the like on the first color electrodes 120A through the mask, for example. The second color organic layers 130B may also be formed by vapor deposition using a mask having through holes corresponding to the second color organic layers 130B. The third color organic layers 130C may also be formed by vapor deposition using a mask having through holes corresponding to the third color organic layers 130C.

Subsequently, as illustrated in FIG. 26, the second electrode forming process may be carried out. The second electrode 140 is formed on the first color organic layers 130A, the second color organic layers 130B, and the third color organic layers 130C. The second electrode 140 may be formed continuously over the entirety of the organic layers 130. For example, the second electrode 140 may be formed by performing vapor deposition of a conductive material or the like such as metal or the like on the organic layers 130 through a mask onto the organic layers 130.

Light that is transmitted through the second display region 102 of the organic device 100 manufactured in this way will be described.

In the second display region 102, there are cases in which optical parts are situated on the rear side of the substrate 110. Light arriving at the organic device 100 is transmitted through the second display region 102 and arrives at the optical parts. The elements 115 are formed in a pattern in the second display region 102, and the first electrodes 120 making up the elements 115 are formed in a pattern. The non-electrode regions 121 where no first electrodes 120 are present are formed around the first electrodes 120, and light arriving at the second display region 102 passes through the non-electrode regions 121 and arrives at the optical parts.

Light that is transmitted through the second display region 102 is diffracted in accordance with the pattern of the first electrodes 120. In a case in which the regularity of layout of the first electrodes 120 is high, intensity of diffracted light can rise. In such cases, the clarity of images generated by the optical parts can deteriorate. For example, in a case in which the pitch of the first color electrodes 120A and the third color electrodes 120Ca following the element first direction G1 is constant, the regularity of layout of the first color electrodes 120A and the third color electrodes 120Ca following the element first direction G1 can be high. In the same way, in a case in which the pitch of the first color electrodes 120A and the third color electrodes 120Cb following the element second direction G2 is constant, the regularity of layout of the first color electrodes 120A and the third color electrodes 120Cb following the element second direction G2 can be high. In a case in which the pitch of the second color electrodes 120B and the third color electrodes 120Cb following the element first direction G1 is constant, the regularity of layout of the second color electrodes 120B and the third color electrodes 120Cb following the element first direction G1 can be high. In a case in which the pitch of the second color electrodes 120B and the third color electrodes 120Ca following the element second direction G2 is constant, the regularity of layout of the second color electrodes 120B and the third color electrodes 120Ca following the element second direction G2 is high.

On the other hand, in the second display region 102 of the organic device 100 according to the present embodiment, the regularity of layout of the first electrodes 120 can be reduced. More specifically, the pitch of the first color electrodes 120A and the third color electrodes 120Ca following the element first direction G1 is arrayed so as to alternate between the second pitch P2 and the third pitch P3. Accordingly, the regularity in layout of the first color electrodes 120A and the third color electrodes 120Ca following the element first direction G1 can be reduced. In the same way, the pitch of the first color electrodes 120A and the third color electrodes 120Cb following the element second direction G2 is arrayed so as to alternate between the second pitch P2 and the third pitch P3. Accordingly, the regularity in layout of the first color electrodes 120A and the third color electrodes 120Cb following the element second direction G2 can be reduced. The pitch of the second color electrodes 120B and the third color electrodes 120Cb following the element first direction G1 is arrayed so as to alternate between the second pitch P2 and the third pitch P3. Accordingly, the regularity in layout of the second color electrodes 120B and the third color electrodes 120Cb following the element first direction G1 can be reduced. The pitch of the second color electrodes 120B and the third color electrodes 120Ca following the element second direction G2 is arrayed so as to alternate between the second pitch P2 and the third pitch P3. Accordingly, the regularity in layout of the second color electrodes 120B and the third color electrodes 120Ca following the element second direction G2 can be reduced.

Thus, according to the present embodiment, the first color electrodes 120A and the third color electrodes 120C of the first electrodes 120 situated in the second display region 102 are arrayed so as to alternate between the second pitch P2 and the third pitch P3 following each of the element first direction G1 and the element second direction G2. The second pitch P2 differs from the third pitch P3. Accordingly, the regularity in layout of the first color electrodes 120A and the third color electrodes 120C can be reduced, and the diffraction of light that is transmitted through the second display region 102 can be weakened. Accordingly, the intensity of diffracted light occurring due to light transmitted through the organic device 100 can be reduced.

Also, according to the present embodiment, the first color electrodes 120A of the first electrodes 120 situated in the first display region 101 and the second display region 102 are arrayed at the first pitch P1 following each of the element first direction G1 and the element second direction G2. Accordingly, the pitch of the first color electrodes 120A situated in the second display region 102 and the pitch of the first color electrodes 120A situated in the first display region 101 can be made to be equal. In this case, the pixel density of the second display region 102 can be made to be equal to the pixel density of the first display region 101. Accordingly, the pixel density of the second display region 102 can be suppressed from deteriorating, and quality of images displayed at the second display region 102 can be improved.

Also, according to the present embodiment, the first color electrodes 120A and the third color electrodes 120C situated in the first display region 101 are arrayed at the fourth pitch P4 following each of the element first direction G1 and the element second direction G2. The fourth pitch P4 is half of the first pitch P1. Accordingly, the first color electrodes 120A and the third color electrodes 120C situated in the first display region 101 can be equidistantly arrayed following each of the element first direction G1 and the element second direction G2. Thus, the quality of images displayed at the first display region 101 can be improved.

Also, according to the present embodiment, a first color electrode 120A and third color electrodes 120C making up one pixel situated in the second display region 102 are arrayed at the second pitch P2 following each of the element first direction G1 and the element second direction G2. The second pitch P2 is smaller than the third pitch P3. Accordingly, the quality of images displayed at the second display region 102 can be improved.

Also, according to the present embodiment, the second color electrodes 120B and the third color electrodes 120C of the first electrodes 120 situated in the second display region 102 are arrayed so as to alternate between the second pitch P2 and the third pitch P3 following each of the element first direction G1 and the element second direction G2. The second pitch P2 differs from the third pitch P3. Accordingly, the regularity in layout of the second color electrodes 120B and the third color electrodes 120C can be reduced, and the diffraction of light that is transmitted through the second display region 102 can be weakened. Accordingly, the intensity of diffracted light occurring due to light transmitted through the organic device 100 can be reduced.

Also, according to the present embodiment, the second color electrodes 120B of the first electrodes 120 situated in the first display region 101 and the second display region 102 are arrayed at the first pitch P1 following each of the element first direction G1 and the element second direction G2. Accordingly, the pitch of the second color electrodes 1208 situated in the second display region 102 and the pitch of the second color electrodes 1208 situated in the first display region 101 can be made to be equal. In this case, the pixel density of the second display region 102 can be made to be equal to the pixel density of the first display region 101. Accordingly, the pixel density of the second display region 102 can be suppressed from deteriorating, and quality of images displayed at the second display region 102 can be improved.

Also, according to the present embodiment, the second color electrodes 120B and the third color electrodes 120C situated in the first display region 101 are arrayed at the fourth pitch P4 following each of the element first direction G1 and the element second direction G2. The fourth pitch P4 is half of the first pitch P1. Accordingly, the second color electrodes 120B and the third color electrodes 120C situated in the first display region 101 can be equidistantly arrayed following each of the element first direction G1 and the element second direction G2. Thus, the quality of images displayed at the first display region 101 can be improved.

Also, according to the present embodiment, a second color electrode 120B and third color electrodes 120C making up one pixel situated in the second display region 102 are arrayed at the second pitch P2 following each of the element first direction G1 and the element second direction G2. The second pitch P2 is smaller than the third pitch P3. Accordingly, the quality of images displayed at the second display region 102 can be improved.

Also, according to the present embodiment, the mask group 56 includes the first mask 50A including the first through holes 53A, the second mask 50B including the second through holes 53B, and the third mask 50C including the third through holes 53C. The first through holes 53A can form the first color electrodes 120A of the first electrodes 120. The second through holes 53B can form the second color electrodes 120B of the first electrodes 120, and the third through holes 53C can form the third color electrodes 120C of the first electrodes 120. Accordingly, the first electrodes 120 can be formed with reduced regularity in layout. Thus, the organic device 100 can be obtained in which intensity of diffracted light can be reduced.

Various modifications can be applied to the embodiment described above. Modifications will be described below with reference to the drawings as necessary. In the description of the present specification and the drawings used in description of the present specification, portions that can be configured in the same way as in the embodiment described above will be denoted by the same symbols as those used for the corresponding portions in the embodiment described above, and repetitive description will be omitted. Also, in cases in which it is clear that advantageous effects obtained in the embodiment described above will be obtained in the modifications as well, description thereof may be omitted.

A first modification will be described.

In the present embodiment described above, an example is described in which the first color electrodes 120A and the third color electrodes 120C situated in the first display region 101 are arrayed at the fourth pitch P4 following each of the element first direction G1 and the element second direction G2. However, the present disclosure is not limited to this.

For example, the first color electrodes 120A and the third color electrodes 120C situated in the first display region 101 may be arrayed in the same way as with the first color electrodes 120A and the third color electrodes 120C situated in the second display region 102.

More specifically, the first color electrodes 120A and the third color electrodes 120C situated in the first display region 101 may be arrayed so as to alternate between the second pitch P2 and the third pitch P3, following each of the element first direction G1 and the element second direction G2. In this case, manufacturing efficiency of the organic device 100 can be improved. For example, in the third electrode array 153 described above, the pitch of a first color electrode 120A and a third color electrode 120Ca making up one element 115 may be the second pitch. Of two elements 115 that are adjacent in the third electrode array 153, the pitch of a first color electrode 120A making up one of the elements 115 and a third color electrode 120Ca making up the other of the elements 115 may be the third pitch P3. In the fourth electrode array 154 described above, the pitch of a first color electrode 120A and a third color electrode 120Cb making up one element 115 may be the second pitch P2. Of two elements 115 that are adjacent in the fourth electrode array 154, the pitch of a first color electrode 120A making up one of the elements 115 and a third color electrode 120Cb making up the other of the elements 115 may be the third pitch P3.

A second modification will be described.

In the present embodiment described above, an example is described in which the second color electrodes 120B and the third color electrodes 120C situated in the first display region 101 are arrayed at the fourth pitch P4 following each of the element first direction G1 and the element second direction G2. However, the present disclosure is not limited to this.

For example, the second color electrodes 120B and the third color electrodes 120C situated in the first display region 101 may be arrayed in the same way as with the second color electrodes 120B and the third color electrodes 120C situated in the second display region 102.

More specifically, the second color electrodes 120B and the third color electrodes 120C situated in the first display region 101 may be arrayed so as to alternate between the second pitch P2 and the third pitch P3, following each of the element first direction G1 and the element second direction G2. In this case, the manufacturing efficiency of the organic device 100 can be improved. For example, in the seventh electrode array 157 described above, the pitch of a second color electrode 120B and a third color electrode 120Cb making up one element 115 may be the second pitch. Of two elements 115 that are adjacent in the seventh electrode array 157, the pitch of a second color electrode 120B making up one of the elements 115 and a third color electrode 120Cb making up the other of the elements 115 may be the third pitch P3. In the eighth electrode array 158 described above, the pitch of a second color electrode 120B and a third color electrode 120Ca making up one element 115 may be the second pitch P2. Of two elements 115 that are adjacent in the eighth electrode array 158, the pitch of a second color electrode 1206 making up one of the elements 115 and a third color electrode 120Ca making up the other of the elements 115 may be the third pitch P3.

A third modification will be described.

In the present embodiment described above, an example is described in which the centers 1150 of the elements 115 situated in the first display region 101 and the centers 1150 of the elements 115 situated in the second display region 102 are arrayed following the element first direction G1, and are arrayed following the element second direction G2. However, the present disclosure is not limited to this.

For example, the centers 1150 of the elements 115 situated in the first display region 101 and the centers 1150 of the elements 115 situated in the second display region 102 may be offset in the element second direction G2. In this case, the first electrode array 151 described above may be situated on an extension line of the third electrode array 153. More specifically, the first color electrodes 120A and the third color electrodes 120Ca situated in the second display region 102, and the first color electrodes 120A and the third color electrodes 120Ca situated in the first display region 101, are arrayed following the element first direction G1. Alternatively, the fifth electrode array 155 may be situated on an extension line of the seventh electrode array 157. More specifically, the second color electrodes 120B and the third color electrodes 120Cb situated in the second display region 102, and the second color electrodes 120B and the third color electrodes 120Cb situated in the first display region 101, are arrayed following the element first direction G1.

For example, the centers 1150 of the elements 115 situated in the first display region 101 and the centers 1150 of the elements 115 situated in the second display region 102 may be offset in the element first direction G1. In this case, the second electrode array 152 described above may be situated on an extension line of the fourth electrode array 154. More specifically, the first color electrodes 120A and the third color electrodes 120Cb situated in the second display region 102, and the first color electrodes 120A and the third color electrodes 120Cb situated in the first display region 101, are arrayed following the element second direction G2. Alternatively, the sixth electrode array 156 may be situated on an extension line of the eighth electrode array 158. More specifically, the second color electrodes 120B and the third color electrodes 120Ca situated in the second display region 102, and the second color electrodes 120B and the third color electrodes 120Ca situated in the first display region 101, are arrayed following the element second direction G2.

A fourth modification will be described.

In the present embodiment described above, an example is described in which the insulating layer 160 is situated between two first electrodes 120 that are adjacent in plan view. However, the present disclosure is not limited to this. In a case in which two color electrodes 120A-120C, which are adjacent to each other, are separated from each other, the insulating layer 160 does not have to be formed.

A fifth modification will be described.

In the present embodiment described above, an example is described in which the first color organic layers 130A is the red color light-emitting layer, and the second color organic layers 130B is the blue color light-emitting layer. However, the present disclosure is not limited to this. The first color organic layers 130A may be the blue color light-emitting layer, and the second color organic layers 130B may be the red color light-emitting layer. In this case, the diameter of the first color electrodes 120A may be larger than the diameter of the second color electrodes 120B.

Although several modifications of the embodiment described above have been described, a plurality of modifications may be combined as appropriate and applied, as a matter of course.

EXAMPLES

Figure 27:
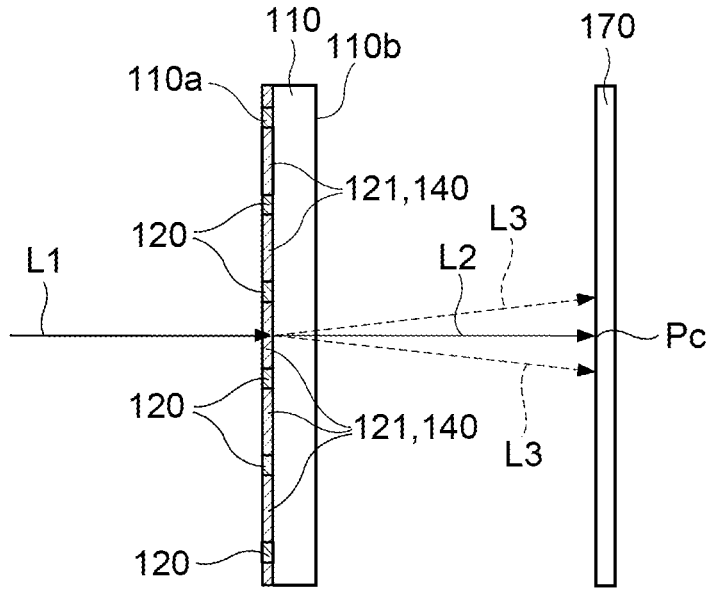
FIG. 27 is a diagram illustrating an evaluation method of diffracted light.
Figure 28:
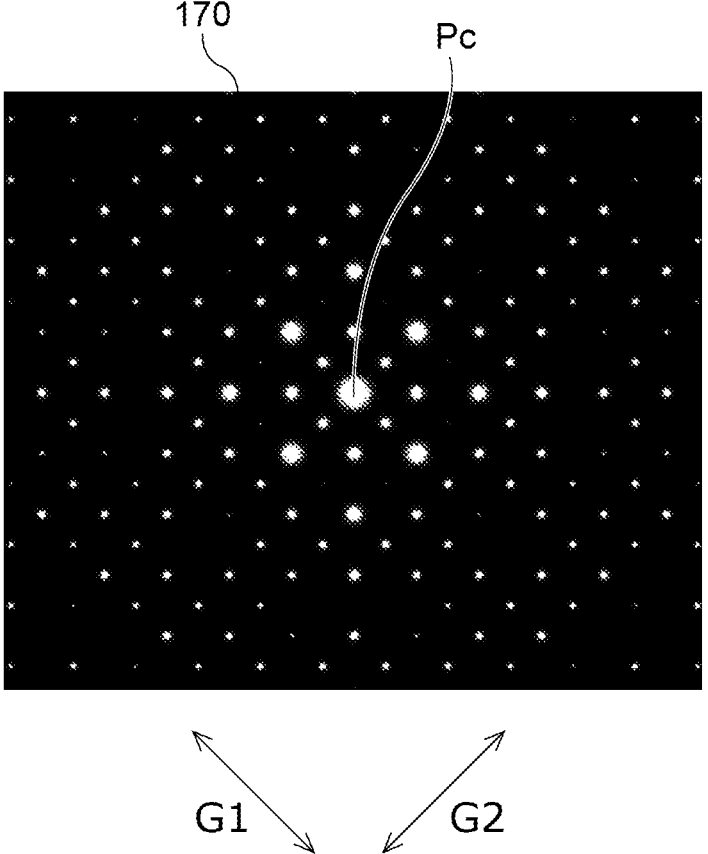
FIG. 28 is a diagram illustrating evaluation results of a projection pattern in Example 1.
Figure 29:
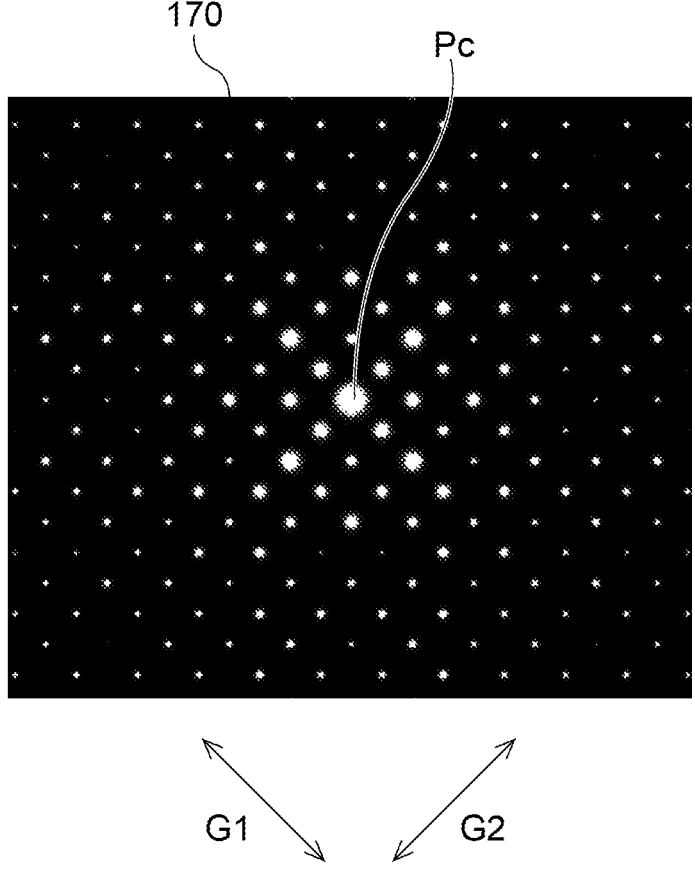
FIG. 29 is a diagram illustrating evaluation results of a projection pattern in Example 2.
Figure 30:
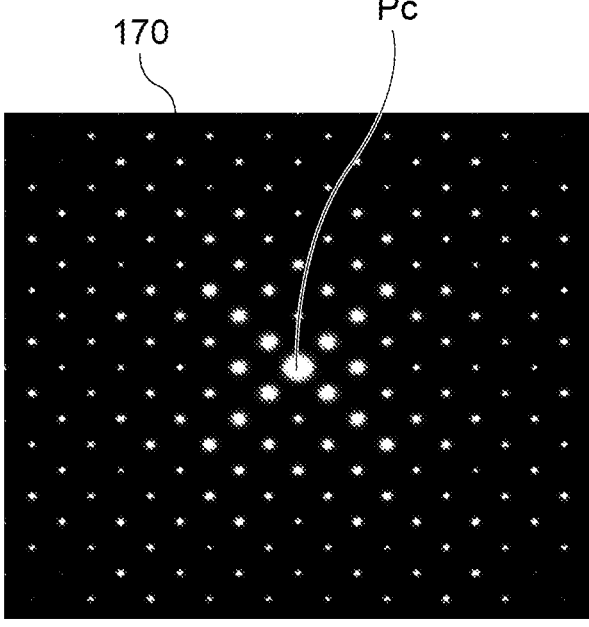
FIG. 30 is a diagram illustrating evaluation results of a projection pattern in Example 3.

Next, the embodiment of the present disclosure will be described in further detail by way of Examples, with reference to FIG. 27-FIG. 30, but the embodiment of the present disclosure is not limited to the description of the Examples below, insofar as not departing from the spirit thereof. FIG. 27 is a diagram illustrating an evaluation method of diffracted light. FIG. 28 is a diagram illustrating evaluation results of a projection pattern in Example 1. FIG. 29 is a diagram illustrating evaluation results of a projection pattern in Example 2, and FIG. 30 is a diagram illustrating evaluation results of a projection pattern in Example 3.

Diffraction occurring in light transmitted through the second display region 102 in which the first electrodes 120 according to Example 1-Example 3 were formed was verified by simulation.

The second display region 102 of the organic device 100 having the first electrodes 120 illustrated in FIG. 5-FIG. 7 was designed. The dimensions of the first pitch P1, the second pitch P2, and the third pitch P3, in each Example, are shown below. Also, the proportion of the second pitch P2 as to the third pitch P3 is also shown.

Example 1

P1: 87.8 μm
P2: 43.9 μm
P3: 43.9 μm
Proportion of P2 as to P3: 1.00

Example 2

P1: 87.8 μm
P2: 35.4 μm
P3: 52.4 μm
Proportion of P2 as to P3: 0.68

Example 3

P1: 87.8 μm
P2: 29.5 μm
P3: 58.3 μm
Proportion of P2 as to P3: 0.51

The planar shapes of the color electrodes 120A-120C are circular shapes. The diameters of the color electrodes 120A-120C are the same in each example, and are as shown below.

Diameter of first color electrodes 120A: 26.1 μm
Diameter of second color electrodes 120B: 32.8 μm
Diameter of third color electrodes 120C: 20.7 μm The second electrode 140 illustrated in FIG. 3 and FIG. 4 is continuously formed over the entirety of the organic layers 130. As a model for simulation, the second electrode 140 was simulated in the non-electrode regions 121 situated around the first electrodes 120, as illustrated in FIG. 27.

Simulation was performed for each of Example 1-Example 3, and the intensity of diffracted light generated by being transmitted through the second display region 102 was obtained. More specifically, as illustrated in FIG. 27, light L1 was incident to the substrate 110 following the normal direction of the first face 110a of the substrate 110. The wavelength of the light L1 is 550 nm, and the diameter of the light L1 is 3 mm. Subsequently, diffraction occurring in the light transmitted through the non-electrode regions 121 and the light transmitted through the first electrodes 120 was calculated by simulation. Symbol L2 represents light that travels straight without being diffracted and arrives at a screen 170. Symbol Pc represents a point of arrival of light L2 on the screen 170. Symbol L3 represents diffracted light occurring due to passing through the non-electrode regions 121. The distance between the second face 110b of the substrate 110 and the screen 170 is 5000 mm.

The transmissivity of the color electrodes 120A-120C is 0%. The transmissivity was transmissivity with respect to light having a wavelength of 550 nm. The transmissivity of the color electrodes 120A-120C can be measured in the same way as with the substrate 110 described above.

The transmissivity of the second electrode 140 was set to 38%. The transmissivity of the organic layers 130 is markedly great as compared to the transmissivity of the second electrode 140, and is negligible. Accordingly, the transmissivity of the non-electrode regions 121 was set to the transmissivity of the second electrode 140.

FIG. 28-FIG. 30 illustrate projection patterns of light arriving at the screen 170 in Example 1-Example 3. In FIG. 28-FIG. 30, diffracted light appearing around the arrival point Pc of the light L2 appears in dot shapes. More specifically, the light L2 arriving at the arrival point Pc represents the peak of 0-order diffracted light. The farther away from the peak of the 0-order diffracted light, peaks of 1-order diffracted light, peaks of 2-order diffracted light, peaks of 3-order diffracted light, and peaks of 4-order diffracted light appear in that order. The greater the magnitude of each diffracted light illustrated in FIG. 28-FIG. 30 is, the stronger this indicates that the intensity of diffracted light is.

In the projection pattern of light illustrated in FIG. 28, the diffracted light is concentrated at particular positions, and it can be understood that the intensity of diffracted light is great. More specifically, the peaks of 2-order diffracted light are relatively strongly appeared in the element first direction G1 and the element second direction G2. The peaks of 1-order diffracted light situated at positions following the element first direction G1 and the element second direction G2 are appeared more weakly than the peaks of 2-order diffracted light. The difference in the intensity of the 1-order diffracted light and the intensity of the 2-order diffracted light is relatively great.

On the other hand, it can be understood that in the projection patterns of light illustrated in FIG. 29 and FIG. 30, the diffracted light is dispersed as compared to the projection pattern of light illustrated in FIG. 28. More specifically, the difference in the intensity of the 1-order diffracted light and the intensity of the 2-order diffracted light is reduced following each of the element first direction G1 and the element second direction G2. Accordingly, it can be said that the intensity of diffracted light is reduced in the cases of Example 2 and Example 3, as compared to the case of Example 1. Thus, according to Example 2 and Example 3, the intensity of diffracted light that is incident to optical parts such as a sensor and so forth can be reduced.

It can be understood that in the projection pattern of light illustrated in FIG. 30, the diffracted light is further dispersed as compared to the projection pattern of light illustrated in FIG. 29. More specifically, the difference in the intensity of the 1-order diffracted light and the intensity of the 2-order diffracted light is reduced even further, in each of the element first direction G1 and the element second direction G2. Thus, it can be said that dispersion of diffracted light can be promoted by making the difference between the second pitch P2 and the third pitch P3 to be great, as illustrated in FIG. 5 and others.

The greatest intensities of diffracted light in Example 1-Example 3 are shown below. The greatest intensities indicate the proportion of the intensities of diffracted light in the 1-order and subsequent diffracted light as to the intensity of the 0-order diffracted light. In Example 1-Example 3, the intensity of diffracted light in the 1-order and subsequent diffracted light is the greatest in the element first direction G1 and the element second direction G2.

Example 1: 5.2%

Example 2: 3.5%

Example 3: 3.2%

Thus, it can be understood that the greatest intensity of diffracted light in Example 2 is smaller than the greatest intensity of diffracted light in Example 1, and that the greatest intensity of diffracted light in Example 3 is smaller than the greatest intensity of diffracted light in Example 2.

The invention claimed is:

1. An organic device having a first display region, and a second display region that is situated at a position different from the first display region in plan view, the organic device comprising:

a substrate;

a first electrode situated on the substrate;

an organic layer situated on the first electrode; and a second electrode that is situated on the organic layer, and that also covers the first electrode in plan view, wherein the first electrode includes a plurality of first color electrodes, a plurality of second color electrodes, and a plurality of third color electrodes, the organic layer includes a plurality of first color organic layers situated on the first color electrodes, a plurality of second color organic layers situated on the second color electrodes, and a plurality of third color organic layers situated on the third color electrodes, one pixel is made up of one of the first color electrodes, one of the second color electrodes, and two of the third color electrodes, the first color electrodes and the third color electrodes are arrayed in an alternating manner following a first direction, and are also arrayed in an alternating manner following a second direction that is orthogonal to the first direction, the first color electrodes that are situated in the first display region and the second display region are arrayed at a first pitch following each of the first direction and the second direction, the first color electrodes and the third color electrodes that are situated in the second display region are arrayed so as to alternate between a second pitch and a third pitch, following each of the first direction and the second direction, and the second pitch differs from the third pitch.

2. The organic device according to claim 1, wherein the first color electrodes and the third color electrodes that are situated in the first display region are arrayed at a fourth pitch, following each of the first direction and the second direction, and the fourth pitch is half of the first pitch.

3. The organic device according to claim 1, wherein the first color electrodes and the third color electrodes that are situated in the first display region are arrayed so as to alternate between the second pitch and the third pitch, following each of the first direction and the second direction.

4. The organic device according to claim 1, wherein the first color electrode and the third color electrodes that make up one of the pixels situated in the second display region are arrayed at the second pitch, following each of the first direction and the second direction, and the second pitch is smaller than the third pitch.

5. The organic device according to claim 1, wherein the second color electrodes and the third color electrodes are arrayed in an alternating manner following the first direction, and are also arrayed in an alternating manner following the second direction, the second color electrodes are arrayed at the first pitch following each of the first direction and the second direction, in each of the first display region and the second display region, and the second color electrodes and the third color electrodes that are situated in the second display region are arrayed so as to alternate between the second pitch and the third pitch, following each of the first direction and the second direction.

6. The organic device according to claim 5, wherein the second color electrodes and the third color electrodes situated in the first display region are arrayed at a fourth pitch, following each of the first direction and the second direction, and the fourth pitch is half of the first pitch.

7. The organic device according to claim 5, wherein the second color electrodes and the third color electrodes that are situated in the first display region are arrayed so as to alternate between the second pitch and the third pitch, following each of the first direction and the second direction.

8. The organic device according to claim 5, wherein the second color electrode and the third color electrodes that make up one of the pixels situated in the second display region are arrayed at the second pitch, following each of the first direction and the second direction, and the second pitch is smaller than the third pitch.

9. The organic device according to claim 1, wherein a proportion of the second pitch as to the third pitch is 0.50-0.70.

* * * * *